United States Patent
Son et al.

(10) Patent No.: US 10,529,788 B2
(45) Date of Patent: Jan. 7, 2020

(54) PATTERN STRUCTURE FOR DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Se Wan Son, Yongin-si (KR); Jung Hwa Kim, Gunpo-si (KR); Jin Sung An, Seongnam-si (KR); Wang Woo Lee, Osan-si (KR); Ji Seon Lee, Seoul (KR); Moo Soon Ko, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/944,832

(22) Filed: Apr. 4, 2018

(65) Prior Publication Data
US 2018/0350889 A1   Dec. 6, 2018

(30) Foreign Application Priority Data

Jun. 5, 2017 (KR) .......................... 10-2017-0069759
Feb. 1, 2018 (KR) .......................... 10-2018-0012947

(51) Int. Cl.
*H01L 27/32*    (2006.01)
*H01L 27/12*    (2006.01)
(Continued)

(52) U.S. Cl.
CPC ...... *H01L 27/3262* (2013.01); *H01L 27/3258* (2013.01); *H01L 27/1218* (2013.01); *H01L 27/1288* (2013.01); *H01L 27/3265* (2013.01); *H01L 29/78603* (2013.01); *H01L 29/78696* (2013.01); *H01L 33/36* (2013.01); *H01L 33/38* (2013.01); *H01L 33/62* (2013.01);
(Continued)

(58) Field of Classification Search
CPC ............ H01L 27/1248; H01L 27/1218; H01L 27/1222; H01L 27/124; H01L 29/78606; H01L 2224/05017; H01L 2224/05027; H01L 2224/05023; H01L 2224/05557; H01L 33/36; H01L 33/38; H01L 33/62; G02F 1/136227
See application file for complete search history.

(56) References Cited

U.S. PATENT DOCUMENTS 6,172,721 B1 * 1/2001 Murade ............. G02F 1/136227
                                                          257/72
6,277,669 B1 * 8/2001 Kung ..................... H01L 24/11
                                                          257/E21.508

(Continued)

FOREIGN PATENT DOCUMENTS

JP    2013-235148    11/2013
KR    10-1050284     7/2011

*Primary Examiner* — David A Zarneke
(74) *Attorney, Agent, or Firm* — F. Chau & Associates, LLC

(57) ABSTRACT

A pattern structure for a display device includes a substrate, a protrusion pattern on the substrate, a first conductive pattern covering an upper surface of the protrusion pattern, an interlayer insulating layer on the first conductive pattern and including a contact hole, and a second conductive pattern on the interlayer insulating layer and connected to the first conductive pattern. The contact hole overlaps the protrusion pattern and the first conductive pattern.

11 Claims, 32 Drawing Sheets

(51) Int. Cl.
    *H01L 29/786*     (2006.01)
    *H01L 33/38*     (2010.01)
    *H01L 33/62*     (2010.01)
    *H01L 33/36*     (2010.01)

(52) U.S. Cl.
    CPC ............... *H01L 2224/0213* (2013.01); *H01L 2224/0224* (2013.01); *H01L 2224/05017* (2013.01); *H01L 2224/05023* (2013.01); *H01L 2224/05027* (2013.01); *H01L 2227/323* (2013.01)

(56) References Cited

U.S. PATENT DOCUMENTS

| | | | | |
|---|---|---|---|---|
| 6,982,769 | B2* | 1/2006 | Ishino | G02F 1/136227 349/113 |
| 8,878,185 | B2* | 11/2014 | Ishigaki | H01L 33/08 257/40 |
| 9,136,288 | B2* | 9/2015 | Ishigaki | H01L 33/08 |
| 9,299,728 | B2* | 3/2016 | Ono | H01L 27/3246 |
| 9,362,409 | B2* | 6/2016 | Ishigaki | H01L 33/08 |
| 2001/0007375 | A1* | 7/2001 | Fjelstad | H01L 23/3114 257/773 |
| 2003/0067755 | A1* | 4/2003 | Haimerl | H01L 24/10 361/773 |
| 2004/0043538 | A1* | 3/2004 | Lo | H01L 23/3114 438/117 |
| 2004/0259290 | A1* | 12/2004 | Brintzinger | H01L 21/563 438/111 |
| 2005/0073247 | A1* | 4/2005 | Yamazaki | H01L 27/3211 313/503 |
| 2005/0260794 | A1* | 11/2005 | Lo | H01L 23/3114 438/108 |
| 2007/0145550 | A1* | 6/2007 | Haba | H01L 21/6835 257/678 |
| 2007/0210457 | A1* | 9/2007 | Lin | H01L 23/49811 257/780 |
| 2008/0023830 | A1* | 1/2008 | Chang | H01L 24/10 257/737 |
| 2008/0284011 | A1* | 11/2008 | Chang | H01L 23/49811 257/737 |
| 2014/0084293 | A1 | 3/2014 | Ahn et al. | |
| 2016/0268553 | A1 | 9/2016 | Free et al. | |
| 2017/0250312 | A1* | 8/2017 | Yamakami | H01L 33/38 |

* cited by examiner

PATTERN STRUCTURE FOR DISPLAY DEVICE AND MANUFACTURING METHOD THEREOF

CROSS-REFERENCE TO RELATED APPLICATIONS

This application claims priority under 35 U.S.C. § 119 to Korean Patent Application No. 10-2017-0069759 filed on Jun. 5, 2017 and Korean Patent Application No. 10-2018-0012947 filed on Feb. 1, 2018, in the Korean Intellectual Property Office, the disclosures of which are incorporated by reference herein in their entireties.

TECHNICAL FIELD

The present disclosure relates to a pattern structure for a display device and a manufacturing method thereof.

DISCUSSION OF THE RELATED ART

Recently, a liquid crystal display (LCD) or an organic light emitting diode (OLED) display is used in a variety of mobile electronic devices such as mobile phones, navigation devices, digital cameras, e-books, portable game consoles, or various other devices as a display device.

The display device includes a plurality of pixels, and each pixel includes a plurality of transistors for driving each pixel. The display device includes a multi-layered structure by stacking and patterning a plurality of conductive layers and insulating layers. Misalignment of a photomask relative to a design during exposure process may result in an unexpected etching of layers in subsequent etching process, and may be the source for a short circuit or penetration of moisture or oxygen.

SUMMARY

According to an exemplary embodiment of the present inventive concept, a pattern structure for a display device includes a substrate, a protrusion pattern positioned on the substrate. The pattern structure further includes a first conductive pattern covering an upper surface of the protrusion pattern, and an interlayer insulating layer positioned on the first conductive pattern and including a contact hole. The pattern structure further includes a second conductive pattern positioned on the interlayer insulating layer and connected to the first conductive pattern through the contact hole. The contact hole overlaps the protrusion pattern and the first conductive pattern.

According to an exemplary embodiment of the present inventive concept, a method for manufacturing a display device includes forming a protrusion pattern on a substrate, forming a first conductive pattern covering an upper surface of the protrusion pattern. The method further includes forming an interlayer insulating layer on the first conductive pattern, and patterning the interlayer insulating layer to form a contact hole to expose a part of the upper surface of the first conductive pattern. The method still further includes forming a second conductive pattern connected to the first conductive pattern through the contact hole on the interlayer insulating layer. The contact hole overlaps the protrusion pattern and the first conductive pattern.

DETAILED DESCRIPTION OF THE EMBODIMENTS

Exemplary embodiments of the present inventive concept will be described more fully hereinafter with reference to the accompanying drawings. The present disclosure may, however, be embodied in many different forms and should not be construed as limited to the embodiments set forth herein.

It will be understood that when an element such as a layer, film, region, or substrate is referred to as being "on" or "connected to" another element, it may be directly on, or connected to the other element or intervening elements may also be present. In contrast, when an element is referred to as being "directly on" another element, there are no intervening elements present. Further, in the specification, the word "on" means positioning on or below the object portion, but does not essentially mean positioning on the upper side of the object portion based on a gravity direction.

Figure 1:
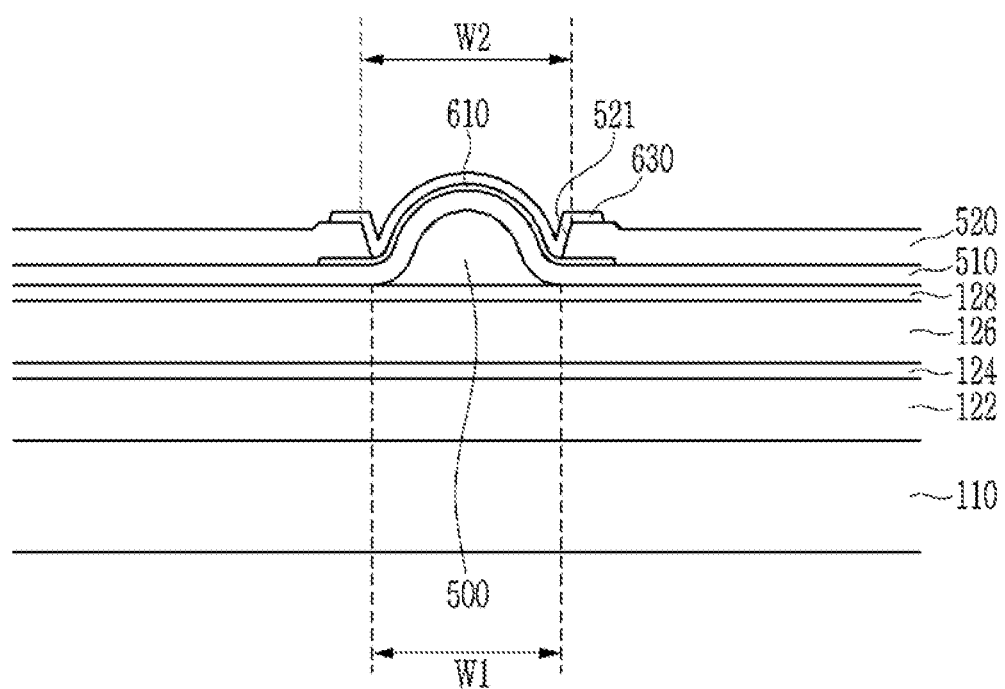
FIG. 1 is a cross-sectional view of a pattern structure for a display device according to an exemplary embodiment of the present inventive concept.

FIG. 1 is a cross-sectional view showing a pattern structure for a display device according to an exemplary embodiment of the present inventive concept.

As shown in FIG. 1, the pattern structure for the display device according to an exemplary embodiment may include a substrate 110, a first conductive pattern 610 positioned on the substrate 110, and a protrusion pattern 500 positioned between the substrate 110 and the first conductive pattern 610.

The substrate 110 may be made of a solid insulating material, for example, glass. A first organic insulating layer 122, a first barrier layer 124, a second organic insulating layer 126, and a second barrier layer 128 may be further positioned between the substrate 110 and the protrusion pattern 500. The first organic insulating layer 122 and the second organic insulating layer 126 may be formed of an organic insulating material, and may be formed as a film type. For example, the first organic insulating layer 122 and the second organic insulating layer 126 may be formed of polyimide. The first barrier layer 124 and the second barrier layer 128 may be formed of an inorganic insulating material. For example, the first barrier layer 124 and the second barrier layer 128 may be made of silicon oxide (SiOx) or silicon nitride (SiNx). In one embodiment, the layer made of the organic insulating material and the layer made of the inorganic insulating material may be alternately stacked between the substrate 110 and the protrusion pattern 500.

In one embodiment, the first organic insulating layer 122, the first barrier layer 124, the second organic insulating layer 126, and the second barrier layer 128 may be omitted. For example, the protrusion pattern 500 may be formed directly on the substrate 110. In another embodiment, the first organic insulating layer 122 and the first barrier layer 124 may be formed on the substrate 110, and the protrusion pattern 500 may be formed directly on the first barrier layer 124. In still another embodiment, the first barrier layer 124 may be formed on the substrate 110, and the protrusion pattern 500 may be formed directly on the first barrier layer 124.

In the manufacturing process, the substrate 110 may be used as a carrier substrate and may be removed later. For example, after forming several constituent elements on the second barrier layer 128 after forming the first organic insulating layer 122, the first barrier layer 124, the second organic insulating layer 126, and the second barrier layer 128 on the substrate 110, the substrate 110 may be separated and removed from the first organic insulating layer 122. In this case, the display device according to an exemplary embodiment may be a flexible display device, and the first organic insulating layer 122 may function as the flexible substrate.

The protrusion pattern 500 may have a protrusions and depressions shape extending from an upper surface of the second barrier layer 128. A height of a center part of the protrusion pattern 500 may be greatest, and the height of the protrusion pattern 500 may gradually decrease from the center part to an edge part. The cross-sectional shape of the protrusion pattern 500 may be substantially semicircular. However, the embodiment is not limited thereto, and the shape of the protrusion pattern 500 may be different in another embodiment.

The protrusion pattern 500 may be made of the organic insulating material. For example, the protrusion pattern 500 may be made of polyimide. However, the embodiment is not limited thereto, and the protrusion pattern 500 may be made of the inorganic insulating material, a metal, a metal oxide, etc.

A buffer layer 510 may be further positioned between the protrusion pattern 500 and the first conductive pattern 610. The buffer layer 510 may be made of the inorganic insulating material, for example, silicon oxide (SiOx), silicon nitride (SiNx), etc. When the protrusion pattern 500 is made of the organic material such as polyimide, the buffer layer 510 may prevent the protrusion pattern 500 from contacting the first conductive pattern 610 such that the protrusion pattern 500 may be prevented from influencing the first conductive pattern 610 in the manufacturing process of the first conductive pattern 610.

The first conductive pattern 610 may be positioned on the protrusion pattern 500 and overlaps the protrusion pattern 500. The first conductive pattern 610 may cover the entire upper surface of the protrusion pattern 500. The first conductive pattern 610 may also be contoured with the protruded shape, depending on the shape of the protrusion pattern 500. Accordingly, when measured in a direction perpendicular to the upper surface of the substrate 110, the distance from the upper surface of the substrate 110 to the center part of the upper surface first conductive pattern 610 may be greater than the distance from the upper surface of the substrate 110 to an edge part of the upper surface of the first conductive pattern 610. For example, the distance from the upper surface of the substrate 110 to the upper surface of the first conductive pattern 610 may gradually decrease from the center part toward the edge part.

The first conductive pattern 610 may be made of the conductive material. For example, the first conductive pattern 610 may be made of a semiconductor material, for example, an amorphous semiconductor, a crystalline semiconductor, an oxide semiconductor, etc. In addition, the first conductive pattern 610 may be formed of the metal, a metal oxide, or the like.

An interlayer insulating layer 520 may be positioned on the first conductive pattern 610 and the buffer layer 510. The interlayer insulating layer 520 may be positioned directly on the first conductive pattern 610. The interlayer insulating layer 520 may include a contact hole 521. The contact hole 521 may be positioned on the first conductive pattern 610, and may expose at least a part of the upper surface of the first conductive pattern 610. For example, the contact hole 521 may be positioned on a center part of the first conductive pattern 610, for example, the protruded part of the first conductive pattern 610. The interlayer insulating layer 520 may cover the edge of the first conductive pattern 610.

In this case, the distance from the upper surface of the substrate 110 to the center part of the first conductive pattern 610 may be greater than the distance from the upper surface of the substrate 110 to the part of the interlayer insulating layer 520 covering the edge of the first conductive pattern 610. For example, the maximum distance from the upper surface of the substrate 110 to the upper surface of the first conductive pattern 610 may be greater than the maximum distance from the upper surface of the substrate 110 to the upper surface of the interlayer insulating layer 520.

In one embodiment, a width W2 of the contact hole 521 may be similar than the width W1 of the protrusion pattern 500. In one embodiment, the width W2 may be the width of a middle part of the contact hole. However, it is not limited thereto. In other embodiments, the width W2 may be the width of a lower part of the contact hole, or the width of an upper part of the contact hole 521. For example, a width difference between W1 and W2 may be within an error range, and the width W2 of the contact hole 521 may be substantially the same as the width W1 of the protrusion pattern 500. In one embodiment, the width of the upper part of the contact hole is greater than a width of the lower part of the contact hole 521. For example, as shown in FIG. 1, the cross section of the contact hole may be slanted and the width of the upper part of the contact hole is greater than the width of the lower part of the contact hole 521.

Although not shown, shapes of the contact hole 521 and the protrusion pattern 500 from the plan view (planar shape) may vary from one embodiment to another embodiment. For example, the planar shape of the contact hole 521 and the planar shape of the protrusion pattern 500 may be circular, quadrangular, etc. The planar shape of the contact hole 521 may be similar to the planar shape of the protrusion pattern 500. While they may not have exactly identical shapes, the planar shape of the contact hole 521 may be substantially the same as the planar shape of the protrusion pattern 500.

When the planar shape of the contact hole 521 and the planar shape of the protrusion pattern 500 are formed to be circular, a diameter of the contact hole 521 may be similar to a diameter of the protrusion pattern 500. In one embodiment, while there may be a difference in the dimeter within thane error range, and the diameter of the contact hole 521 may be substantially the same as the diameter of the protrusion pattern 500.

A second conductive pattern 630 may be positioned on the interlayer insulating layer 520. The second conductive pattern 630 overlaps the contact hole 521 and may be formed to be filled in the contact hole 521. Accordingly, the second conductive pattern 630 may be connected to the first conductive pattern 610 through the contact hole 521. The second conductive pattern 630 may be in contact with the center part of the first conductive pattern 610, for example, the protruded part of the first conductive pattern 610.

In case the first conductive pattern 610 is formed with a flat shape, the contact area between the first conductive pattern 610 and the second conductive pattern 630 may be similar to the area of the contact hole 521. In the present exemplary embodiment, the first conductive pattern 610 is formed of the protruded shape, and the contact area between the first conductive pattern 610 and the second conductive pattern 630 may be greater than the area of the contact hole 521. For example, in the present exemplary embodiment, as the first conductive pattern 610 is positioned on the protrusion pattern 500 and the contact hole 521 overlaps the protrusion pattern 500 and the first conductive pattern 610, the contact area between the first conductive pattern 610 and the second conductive pattern 630 may be relatively increased. Accordingly, contact resistance between the first conductive pattern 610 and the second conductive pattern 630 may decrease.

The second conductive pattern 630 may be made of the conductive material. For example, the second conductive pattern 630 may be made of the semiconductor material, for example, the amorphous semiconductor, the crystalline semiconductor, the oxide semiconductor, etc. Also, the second conductive pattern 630 may be made of the metal, the metal oxide, etc.

Next, a manufacturing method of the pattern for the display device according to an exemplary embodiment will be described with reference to FIG. 2 to FIG. 8.

FIG. 2 to FIG. 8 are cross-sectional views showing a manufacturing method for a display device according to an exemplary embodiment.

Figure 2:
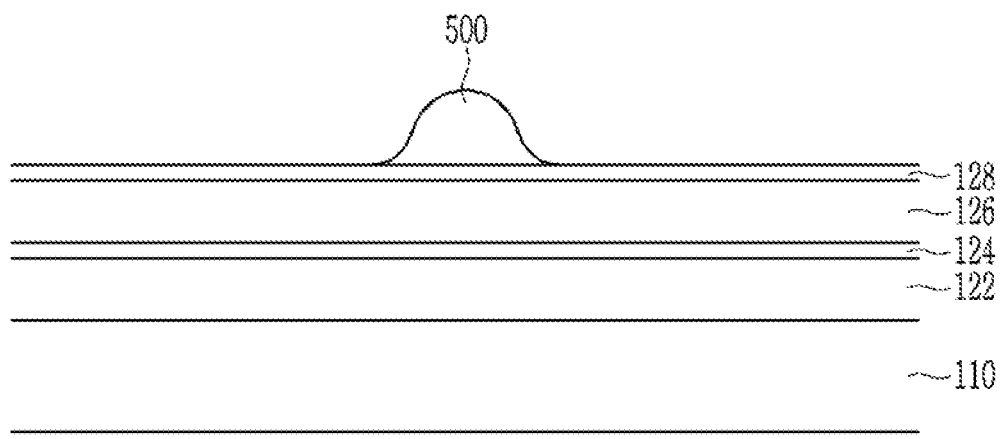
FIG. 2 to FIG. 8 are cross-sectional views showing a manufacturing method for a display device according to an exemplary embodiment of the present inventive concept.

As shown in FIG. 2, the first organic insulating layer 122 may be formed on the substrate 110 by using the organic insulating material, for example, polyimide. The first barrier layer 124 may be formed on the first organic insulating layer 122 by using the inorganic insulating material, for example, silicon oxide (SiOx), silicon nitride (SiNx), etc. The second organic insulating layer 126 may be formed on the first barrier layer 124 by using the organic insulating material, for example, polyimide, etc. The second barrier layer 128 may be formed on the second organic insulating layer 126 by using the inorganic insulating material, for example, silicon oxide (SiOx), silicon nitride (SiNx), etc. For example, the organic insulating material and the inorganic insulating material may be alternately deposited to form the first organic insulating layer 122, the first barrier layer 124, the second organic insulating layer 126, and the second barrier layer 128. However, the embodiment is not limited thereto, and at least one of the steps of forming the first organic insulating layer 122, the first barrier layer 124, the second organic insulating layer 126, and the second barrier layer 128 may be omitted.

The organic insulating material may be coated on the second barrier layer 128 and is patterned to form a protrusion pattern 500. For example, the organic insulating material may include polyimide. However, the embodiment is not limited thereto, and the protrusion pattern 500 may be formed by using the inorganic insulating material, the metal, the metal oxide, etc.

The protrusion pattern 500 may include the protrusion and depression, and may be extending from the upper surface of the second barrier layer 128. The height of the center part of the protrusion pattern 500 is greatest, and the height of the protrusion pattern 500 may gradually decrease from the center part to the edge part. The cross-sectional shape of the protrusion pattern 500 may be substantially semicircular. However, the embodiment is not limited thereto, and the shape of the protrusion pattern 500 may be different in another embodiment.

Figure 3:
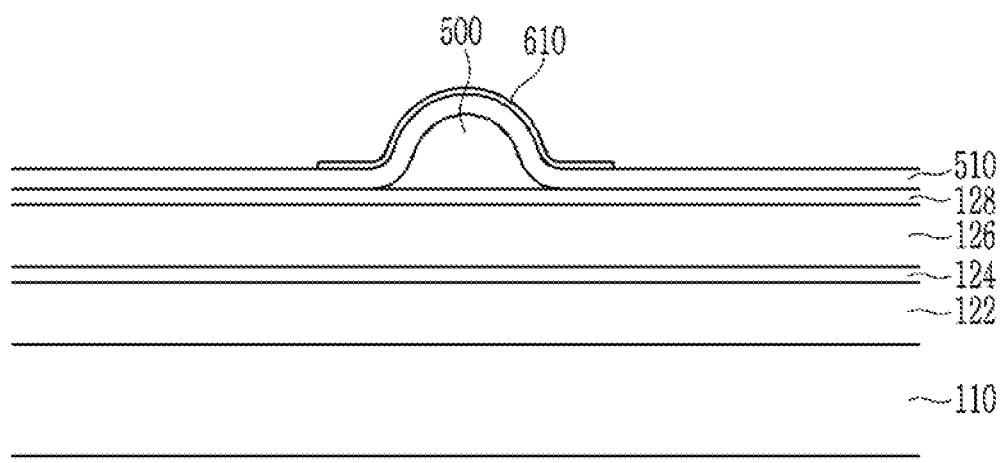

As shown in FIG. 3, the buffer layer 510 may be formed on the protrusion pattern 500 and the second barrier layer 128. In one embodiment, the formation process of the buffer layer 510 may be omitted. In another embodiment, the protrusion pattern 500 may include the organic material, and the buffer layer 510 may be formed to prevent the protrusion pattern 500 from affecting one or more other layers.

The conductive material may be formed on the buffer layer 510, and patterned to form the first conductive pattern 610. The conductive material may be made of the semiconductor material, for example, the amorphous semiconductor, the crystalline semiconductor, the oxide semiconductor, etc., or the metal, the metal oxide, etc.

The first conductive pattern 610 may be patterned to overlap the protrusion pattern 500. In one embodiment, the first conductive pattern 610 may be contoured with the protruded shape to cover the entire surface of the protrusion pattern 500. For example, the first conductive pattern 610 positioned on the protrusion pattern 500 may have the protruded shape depending on the shape of the protrusion pattern 500. Accordingly, when measured in a direction perpendicular to the upper surface of the substrate 110, the distance from the upper surface of the substrate 110 to the center part of the upper surface first conductive pattern 610 may be greater than the distance from the upper surface of the substrate 110 to the edge part of the upper surface of the first conductive pattern 610. For example, the distance from the upper surface of the substrate 110 to the upper surface of the first conductive pattern 610 may gradually decrease from the center part toward the edge part.

Figure 4:
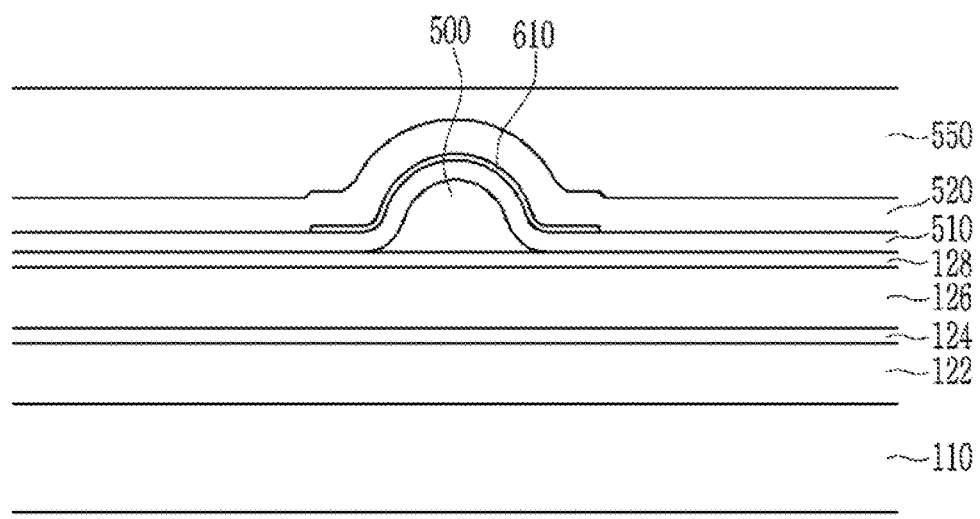

As shown in FIG. 4, the interlayer insulating layer 520 may be formed on the first conductive pattern 610 and the buffer layer 510. The interlayer insulating layer 520 may be positioned directly on the first conductive pattern 610. A photoresist 550 may be coated on the interlayer insulating layer 520. The upper surface of the photoresist 550 may be formed to be flat. Accordingly, the part of the photoresist 550 overlapping the protrusion pattern 500 may be thinner than the part of the photoresist 550 that does not overlap the protrusion pattern 500.

Figure 5:
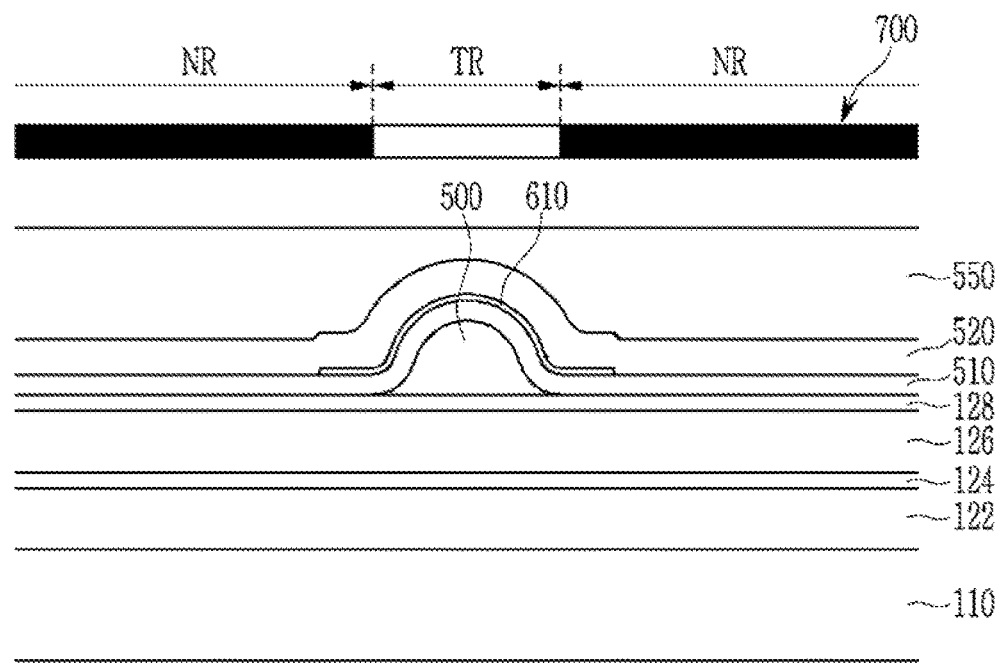

As shown in FIG. 5, a photomask 700 may be arranged on the photoresist 550 and an exposure process may be executed. The photomask 700 may include a non-transmission part NR blocking light and a transmission part TR passing light. The part of the photoresist 550 corresponding to the non-transmission part NR of the photomask 700 may not be almost substantially exposed to the light, and the part of the photoresist 550 corresponding to the transmission part TR of the photomask 700 may be mainly exposed to the light. The transmission part TR of the photomask 700 corresponds to the part where the protrusion pattern 500 is formed, and the non-transmission part NR corresponds to the part where the protrusion pattern 500 is not formed.

Figure 6:
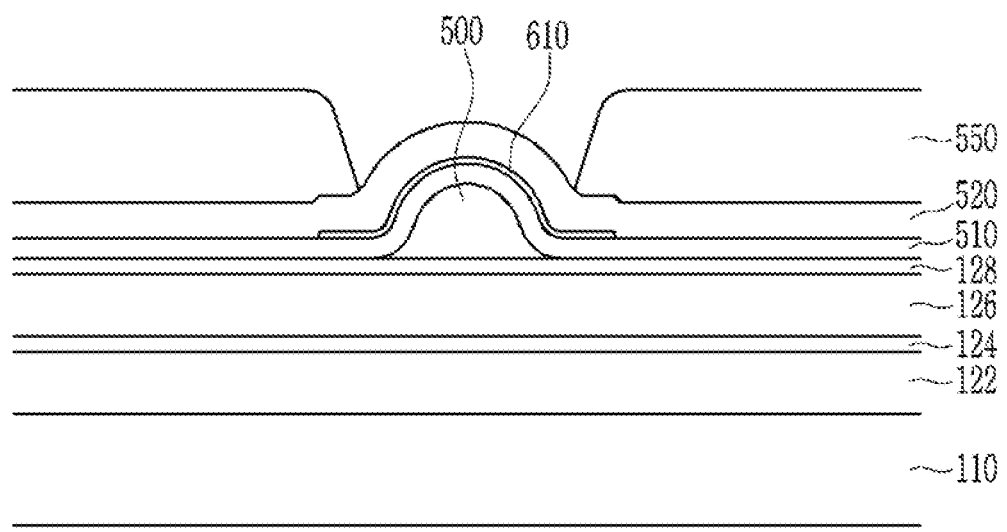

If the photoresist 550 that undergoes the exposure process is developed to be patterned, as shown in FIG. 6, the part of the photoresist 550 exposed to the light may be removed, and the part of the photoresist 550 that is not exposed to the light may remain. A design of the photomask (700 of FIG. 5) may be changed depending on the characteristics of the photoresist 550, and in this case, the part of the photoresist exposed to the light may remain.

In one embodiment, the exposure and developing process conditions may be set based on a part of the photoresist 550 overlapping the protrusion pattern 500 that may be thinner than a part of the photoresist 550 that does not overlap the protrusion pattern 500. For example, the exposure and developing conditions may be such that the part of the photoresist 550 overlapping the protrusion pattern 500 is removed, and the part of the photoresist 550 outside the protrusion pattern 500 may not be removed in a direction perpendicular to a surface of the substrate since, for example, the light may not arrive at the bottom of the thicker photoresist 550. Accordingly, in one example, the photoresist 550 may be patterned in a slanted direction as shown in FIG. 6.

Figure 7:
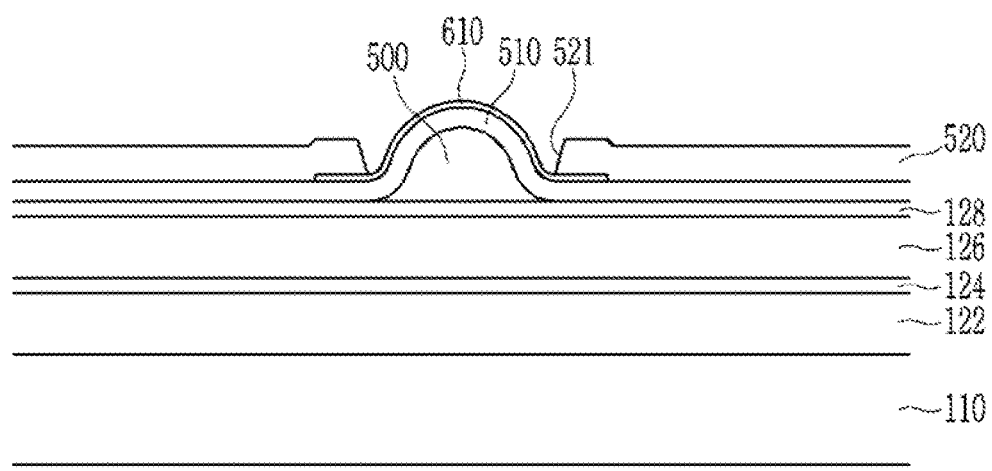

If the interlayer insulating layer 520 is etched by using the patterned photoresist 550 as a mask, as shown in FIG. 7, the contact hole 521 may be formed in the interlayer insulating layer 520. The contact hole 521 may expose at least part of the surface of the first conductive pattern 610. The contact hole 521 may be positioned on the center part of the first conductive pattern 610. For example, the contact hole 521 may be positioned on the protruded part of the first conductive pattern 610. The part of the interlayer insulating layer 520 covering the edge of the first conductive pattern 610 may remain. In one example, the contact hole 521 may be patterned in a slanted direction as shown in FIG. 7. However, the invention is not limited thereto. For example, the contact hole 521 may be patterned in a direction perpendicular to the surface of the substrate.

In this case, when measured in a direction perpendicular to the upper surface of the substrate 110, the maximum distance from the upper surface of the substrate 110 to the upper surface of the first conductive pattern 610 may be greater than the maximum distance from the upper surface of the substrate 110 to the upper surface of the interlayer insulating layer 520. In one embodiment, the diameter or the width of the contact hole 521 may be substantially the same as the diameter or the width of the protrusion pattern 500. When viewed in a direction perpendicular to the upper surface of the substrate 110, the planar shape of the contact hole 521 may be substantially the same as the planar shape of the protrusion pattern 500.

Figure 8:
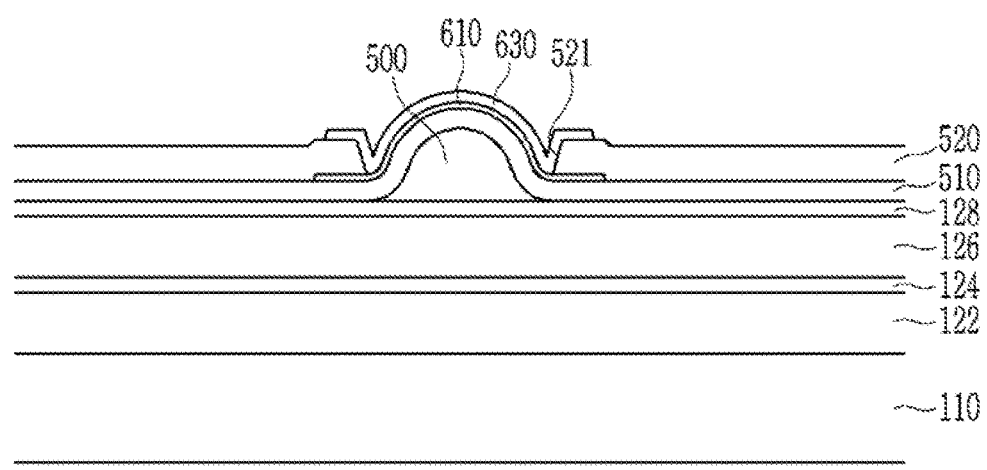

As shown in FIG. 8, the conductive material may be formed on the interlayer insulating layer 520, and may be patterned to form the second conductive pattern 630. The conductive material may be made of the semiconductor material, for example, the amorphous semiconductor, the crystalline semiconductor, the oxide semiconductor, etc., or the metal, the metal oxide, etc.

The second conductive pattern 630 may overlap the contact hole 521, and may fill the contact hole 521. Accordingly, the second conductive pattern 630 may be connected to the first conductive pattern 610 through the contact hole 521. The second conductive pattern 630 may be in contact with the center part of the first conductive pattern 610. For example, the second conductive pattern 630 may be in contact with the protruded part of the first conductive pattern 610.

In the present exemplary embodiment, as above-described, the part of the photoresist 550 overlapping the protrusion pattern 500 may be formed to be thinner than the part that does not overlap the protrusion pattern 500. In one embodiment, the exposure and developing process may be executed based on the thinner part of the photoresist 550 than other parts. Accordingly, compared with an example where the protrusion pattern 500 is not formed, the area of the part that the photoresist 550 is removed is smaller for an example where the protrusion pattern 500 is formed. For example, compared with the example where the protrusion pattern 500 is not formed, the area of the contact hole 521, when viewed from a direction perpendicular to the surface of the substrate, may be formed to be smaller for a sample in which the protrusion pattern 500 is formed. Accordingly, even if misalignment of the photomask (700 of FIG. 5) takes place with respect to the protrusion pattern 500, the position of the contact hole 521 may be prevented from being significantly changed from its designed position. For example, the position of the contact hole 521 may not substantially significantly deviate from the position of the protrusion pattern 500. In another example, the position of the contact hole 521 may not substantially significantly deviate from the position of the first conductive pattern 610.

Accordingly, in case the photomask (700 of FIG. 5) is misaligned with respect to the contact hole 521, the first organic insulating layer 122, the first barrier layer 124, the second organic insulating layer 126, the second barrier layer 128, the buffer layer 510, etc. all of which are positioned under the interlayer insulating layer 520, may be prevented from being damaged by subsequent processing.

For example, the first organic insulating layer 122, the first barrier layer 124, the second organic insulating layer 126, the second barrier layer 128, the buffer layer 510, etc. may be formed under the first conductive pattern 610 such that they are not exposed to the, for example, etching process. Accordingly, none of the first organic insulating layer 122, the first barrier layer 124, the second organic insulating layer 126, the second barrier layer 128, the buffer layer 510, etc. may not be damaged from the subsequent etching process.

Even if the area of the contact hole 521 is smaller for the example where the protrusion pattern 500 is formed, the contact area between the first conductive pattern 610 and the second conductive pattern 630 may not be substantially reduced due to the protruded shape of the first conductive pattern 610. Accordingly, the contact resistance between the first conductive pattern 610 and the second conductive pattern 630 may be decreased while the area of the contact hole 521 is formed to be small.

Next, the substrate 110 may be separated from the first organic insulating layer 122 to remove the substrate 110. The flexible display device may be realized according to the removal of the substrate 110. In one embodiment, the first organic insulating layer 122 may have the function of the flexible substrate. The substrate made of the solid material, for example, glass, may not be included in the flexible display device. Therefore, the flexible display device may be vulnerable to the penetration of moisture and oxygen from outside. In the present exemplary embodiment, as above-described, even if the misalignment of the photomask (700 of FIG. 5) occurs, the first organic insulating layer 122 may be prevented from being damaged in the subsequent process. Therefore, the penetration of moisture or oxygen through the first organic insulating layer 122 may be prevented.

Next, an example where the misalignment of the photomask occurs during the pattern deposition process for the display device according to an exemplary embodiment will be described with reference to FIG. 9 to FIG. 12.

FIG. 9 to FIG. 12 are cross-sectional views showing a manufacturing method for a display device according to an exemplary embodiment of the present inventive concept. FIG. 9 to FIG. 12 show the example that the misalignment of the photomask is generated in the process of patterning the photoresist to form the contact hole.

Figure 9:
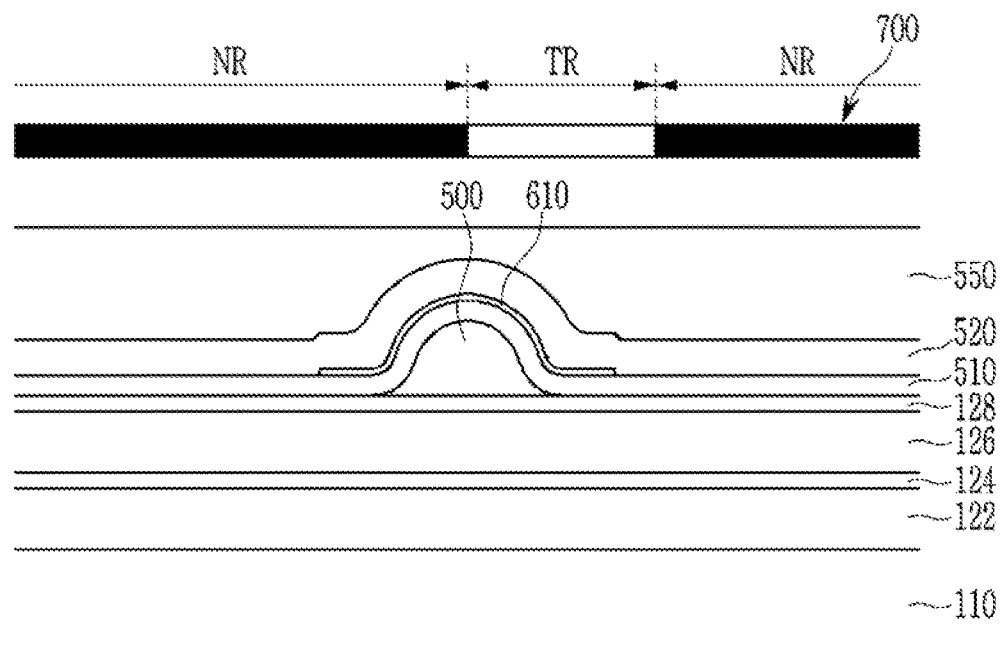
FIG. 9 to FIG. 12 are cross-sectional views showing a manufacturing method for a display device according to an exemplary embodiment of the present inventive concept.

As shown in FIG. 9, the protrusion pattern 500, the first conductive pattern 610, the interlayer insulating layer 520, the photoresist 550, etc. may be formed on the substrate 110. The photomask 700 may be aligned on the photoresist 550 and the exposure process is executed.

In FIG. 9, the photomask 700 may be misaligned, and the position of the transmission part TR and the non-transmission part NR of the photomask 700 may be shifted from the position of the transmission part TR and the non-transmission part NR of the photomask 700 in FIG. 5. In one example, the position of the transmission part TR of the photomask 700 may not completely align with the protrusion pattern 500. For example, when viewed from a direction perpendicular to the surface of the substrate, about half width of the transmission part TR of the photomask 700 may overlap the protrusion pattern 500, and the other half of the transmission part TR may be positioned outside the protrusion pattern 500.

Figure 10:
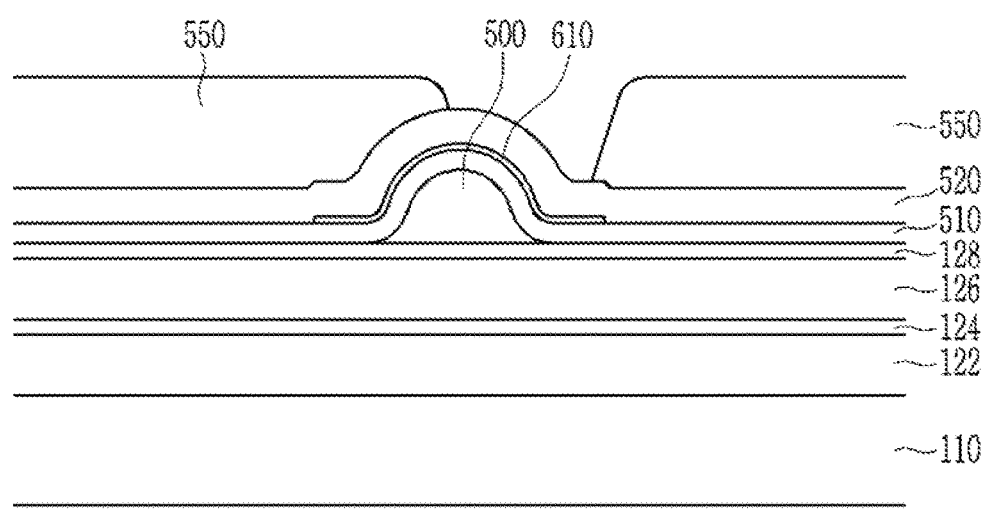

After the exposure process, as shown in FIG. 10, the photoresist 550 may be developed to be patterned. As shown, the part of the photoresist 550 exposed to the light may be removed and the part of the photoresist 550 that is not exposed to the light may remain. In this case, the part of the photoresist 550 that does not overlap the protrusion pattern 500 may be thicker than the part of the photoresist 550 overlapping the protrusion pattern 500, and, for example, may not be provided with the light for the exposure process. Accordingly, a part in the part of the photoresist 550 exposed to the light may not be removed, but instead may remain.

Figure 11:
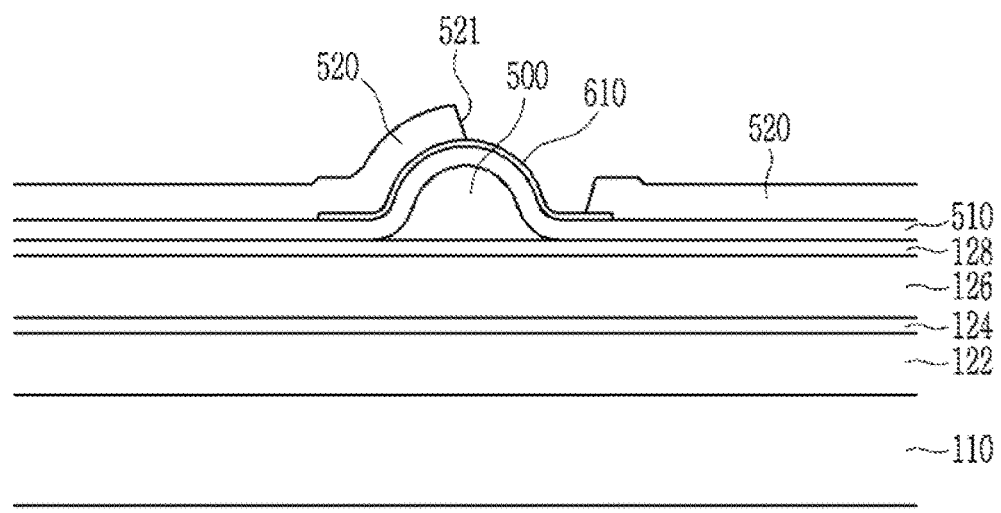

If the interlayer insulating layer 520 is etched by using the patterned photoresist 550 as the mask, as shown in FIG. 11, the contact hole 521 may be formed in the interlayer insulating layer 520. Even if the misalignment of the photomask (700 of FIG. 9) occurs, the position of the contact hole 521 may not be significantly changed from its designed position. The first conductive pattern 610 may formed under the contact hole 521 such that the underlying buffer layer 510 may not be exposed. Accordingly, the buffer layer 510 or other underlying layers may be prevented from being damaged in the subsequent process.

Figure 12:
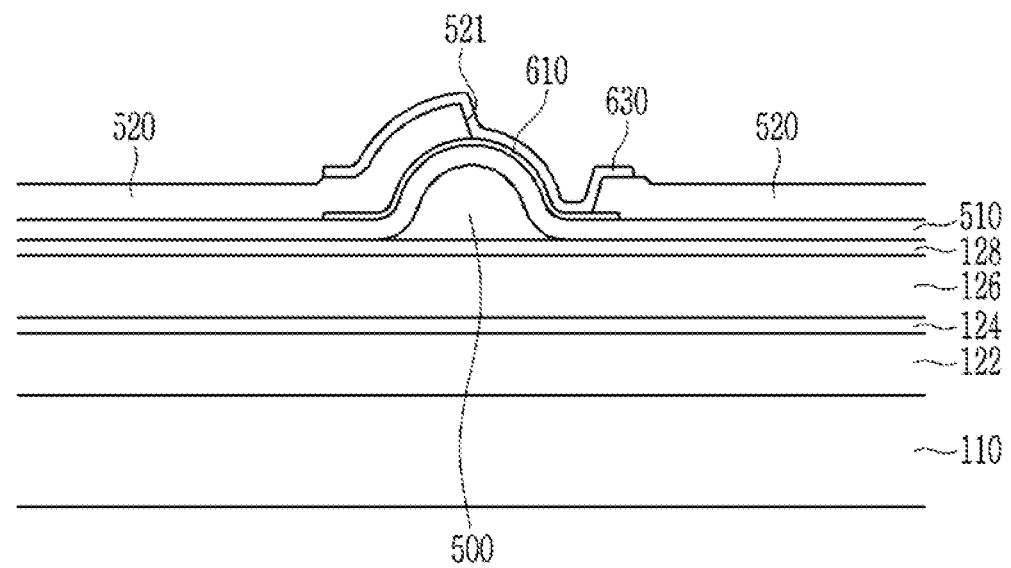

As shown in FIG. 12, the second conductive pattern 630 may be formed on the interlayer insulating layer 520. The second conductive pattern 630 may be connected to the first conductive pattern 610 through the contact hole 521.

Next, the pattern structure for the display device according to an exemplary embodiment will be described with reference to FIG. 13.

Figure 13:
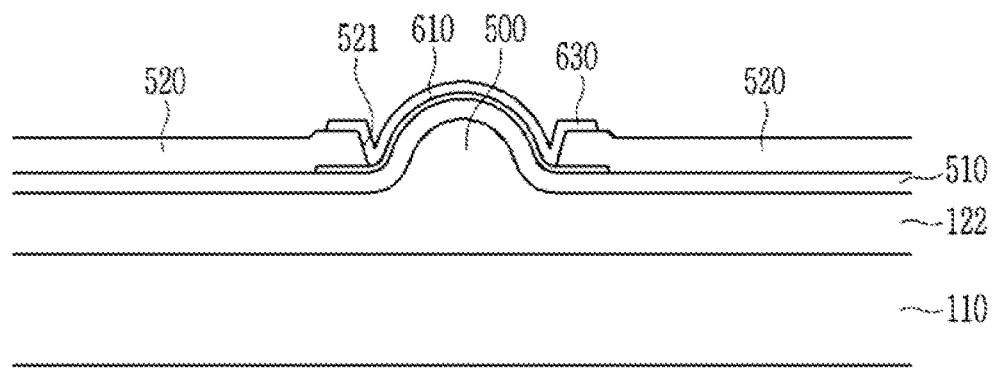
FIG. 13 is a cross-sectional view showing a pattern structure for a display device according to an exemplary embodiment of the present inventive concept.

The description for the display device according to an exemplary embodiment shown in FIG. 13 may be omitted since the pattern structure for the display device according to an exemplary embodiment shown in FIG. 13 is substantially the same as the pattern structure for the display device according to an exemplary embodiment shown in FIG. 1. In the present exemplary embodiment, for example, the first organic insulating layer and the protrusion pattern are integrally made, which may be different from the previous exemplary embodiment, and will be further described.

FIG. 13 is a cross-sectional view showing a pattern structure for a display device according to an exemplary embodiment of the present inventive concept.

The pattern structure for the display device according to an exemplary embodiment may include the substrate 110, the first conductive pattern 610 positioned on the substrate 110, and the protrusion pattern 500 positioned between the substrate 110 and the first conductive pattern 610. The interlayer insulating layer 520 including the contact hole 521 may be formed on the first conductive pattern 610, and the second conductive pattern 630 may be connected to the first conductive pattern 610 through the contact hole 521.

The first organic insulating layer 122 may be further positioned between the substrate 110 and the protrusion pattern 500. In one example, the first organic insulating layer 122 and the protrusion pattern 500 may be integrally formed. The first organic insulating layer 122 and the protrusion pattern 500 may be made of the same material and may be formed in the same process. For example, the first organic insulating layer 122 and the protrusion pattern 500 may be made of the organic insulating material, for example, polyimide. As the first organic insulating layer 122 and the protrusion pattern 500 are formed in the same process, a process time may be reduced and a processing cost may also be reduced.

Next, the pattern manufacturing method for the display device according to an exemplary embodiment of the present inventive concept will be described with reference to FIG. 14 to FIG. 17.

The description for the display device according to an exemplary embodiment shown in FIG. 14 to FIG. 17 may be omitted since the pattern structure for the display device according to an exemplary embodiment shown in FIG. 14 to FIG. 17 is substantially same as the pattern structure for the display device according to an exemplary embodiment shown in FIG. 2 to FIG. 8. In the present exemplary embodiment, for example, the contact hole may be formed without the photomask, which may be different from the previous exemplary embodiment, and will be further described.

FIG. 14 to FIG. 17 are cross-sectional views showing a manufacturing method for a display device according to an exemplary embodiment of the present inventive concept.

Figure 14:
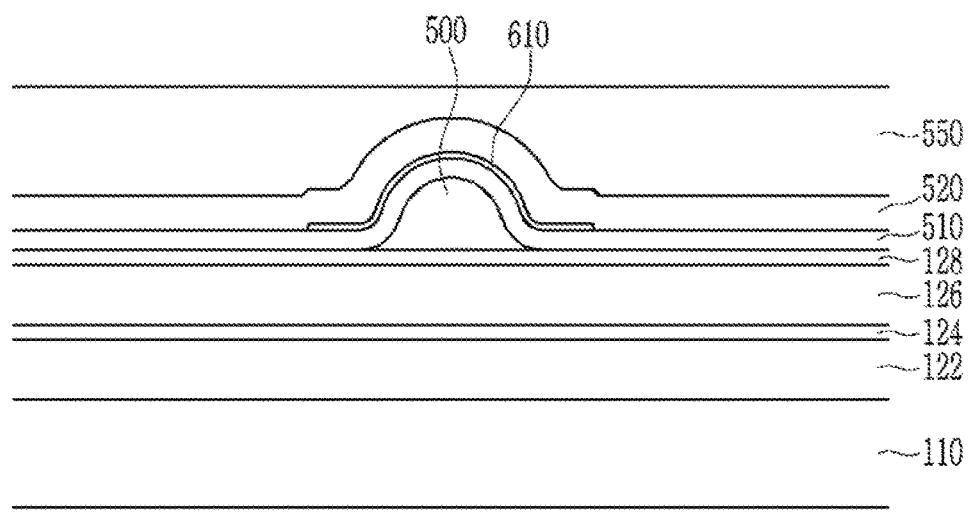
FIG. 14 to FIG. 17 are cross-sectional views showing a manufacturing method for a display device according to an exemplary embodiment of the present inventive concept.

As shown in FIG. 14, the protrusion pattern 500, the first conductive pattern 610, the interlayer insulating layer 520, the photoresist 550, etc. may be formed on the substrate 110. The upper surface of the photoresist 550 may be flat such that the part of the photoresist 550 overlapping the protrusion pattern 500 may be thinner than the part of the photoresist 550 that does not overlap the protrusion pattern 500.

In the previous exemplary embodiment, the photomask may be aligned on the photoresist 550 and the exposure process is executed. On the other hand, the photomask is not used and the exposure process is not executed in the present exemplary embodiment.

Figure 15:
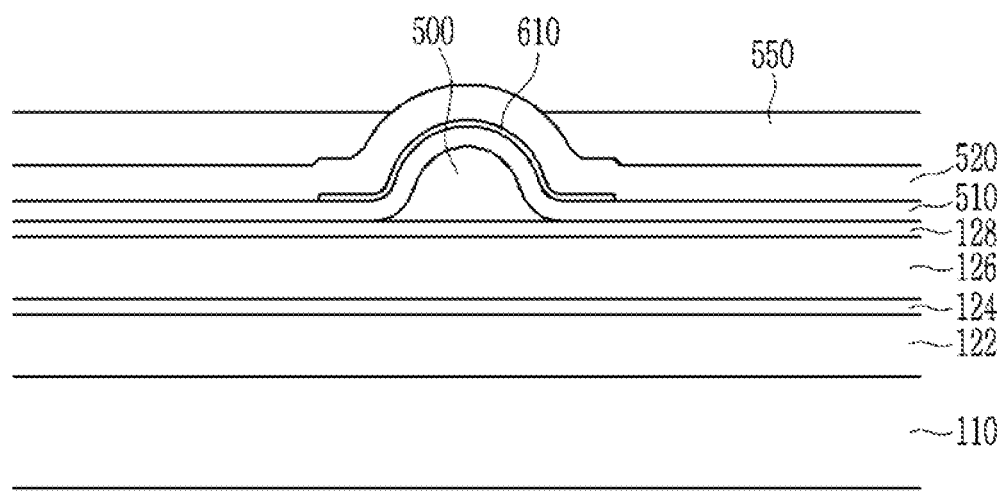

If the photoresist 550 is patterned without the exposure process, as shown in FIG. 15, the thickness of the entire photoresist 550 may decrease. In this case, the part of the photoresist 550 having the relatively thin thickness may be removed during the pattering process. For example, the part of the photoresist 550 overlapping the protrusion pattern 500 may be removed, and the part of the photoresist 550 that does not overlap the protrusion pattern 500 may remain. By removing the part of the photoresist 550, a part of the interlayer insulating layer 520 may be exposed. For example, as shown in FIG. 16, the part of the interlayer insulating layer 520 overlapping the protrusion pattern 500 may be exposed.

Figure 16:
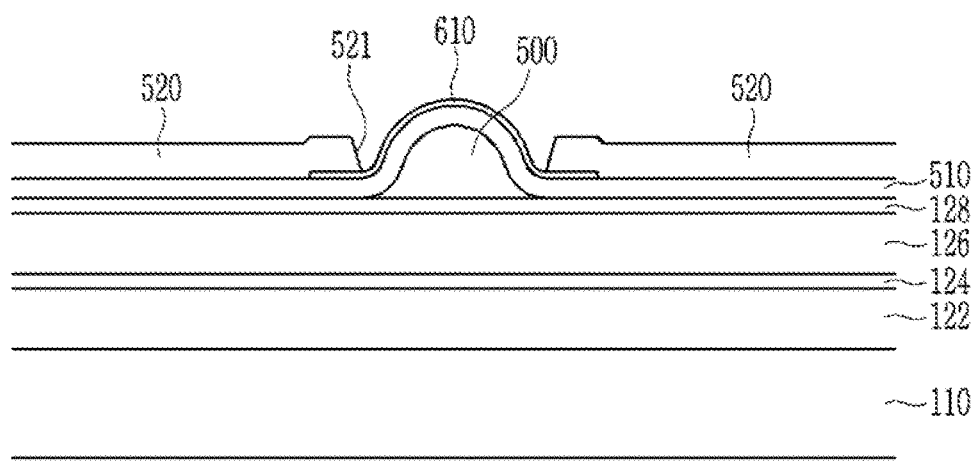

If the interlayer insulating layer 520 is etched by using the patterned photoresist 550 as the mask, as shown in FIG. 16, the contact hole 521 may be formed in the interlayer insulating layer 520. For example, the part of the interlayer insulating layer 520 exposed due to the removal of the photoresist 550 may be etched. The contact hole 521 may be positioned on the center part of the first conductive pattern 610, for example, the protruded part of the first conductive pattern 610.

As above-described, in the present exemplary embodiment, the contact hole 521 may be formed in the interlayer insulating layer 520 without using the photomask, the problem due to the misalignment of the photomask may be prevented.

In one example, when measured in a direction perpendicular to the upper surface of the substrate, the maximum distance from the upper surface of the substrate 110 to the upper surface of the first conductive pattern 610 may be greater than the maximum distance from the upper surface of the substrate 110 to the upper surface of the interlayer insulating layer 520. The diameter or the width of the contact hole 521 may be substantially the same as the diameter or the width of the protrusion pattern 500. The planar shape of the contact hole 521 may be substantially the same as the planar shape of the protrusion pattern 500.

Figure 17:
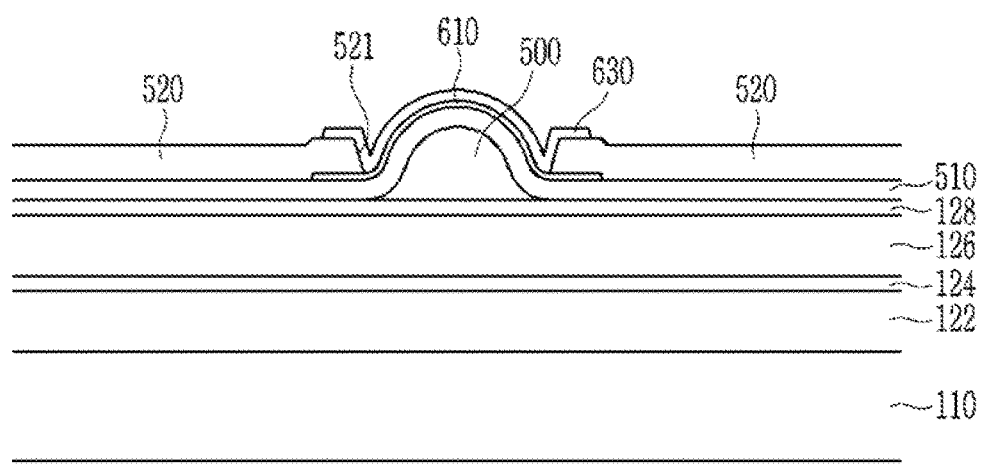

As shown in FIG. 17, the second conductive pattern 630 may be formed on the interlayer insulating layer 520. The second conductive pattern 630 may be connected to the first conductive pattern 610 through the contact hole 521.

Next, the pattern manufacturing method for the display device according to an exemplary embodiment of the present inventive concept will be described with reference to FIG. 18 to FIG. 20.

Figure 18:
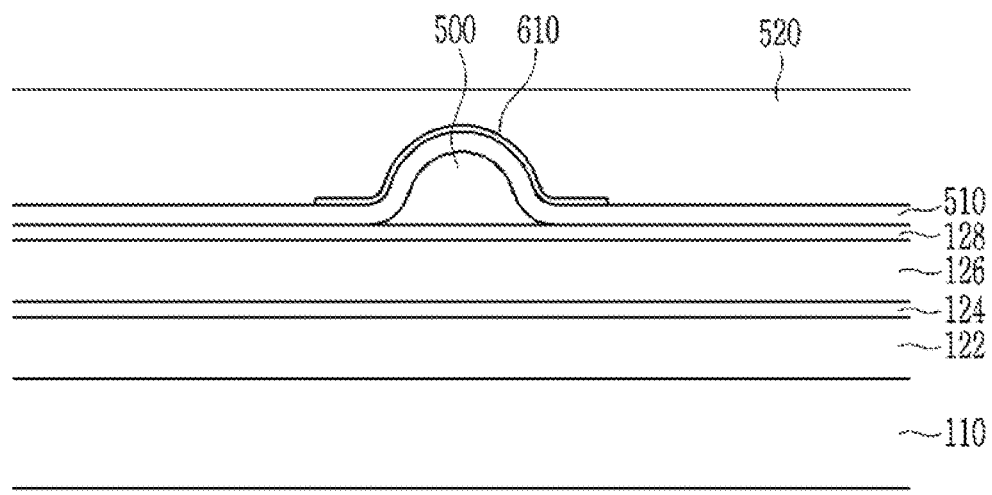
FIG. 18 to FIG. 20 are cross-sectional views showing a manufacturing method for a display device according to an exemplary embodiment of the present inventive concept.
Figure 19:
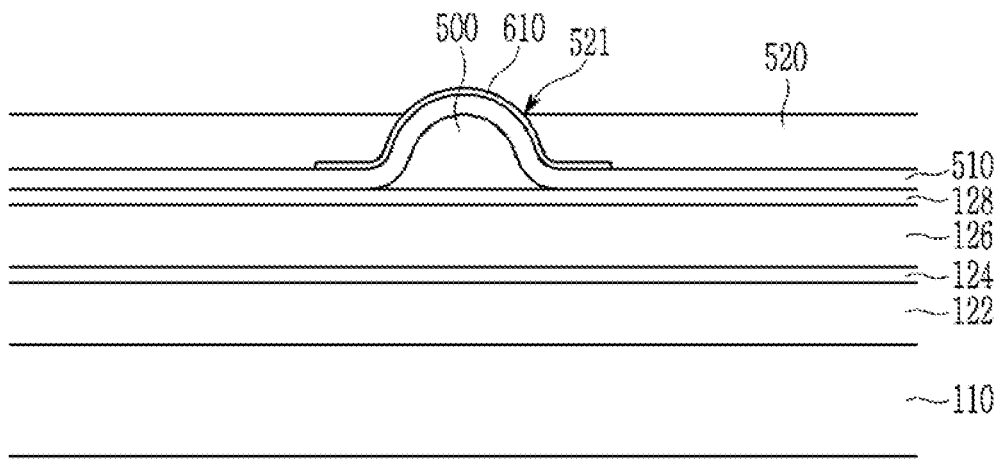
Figure 20:
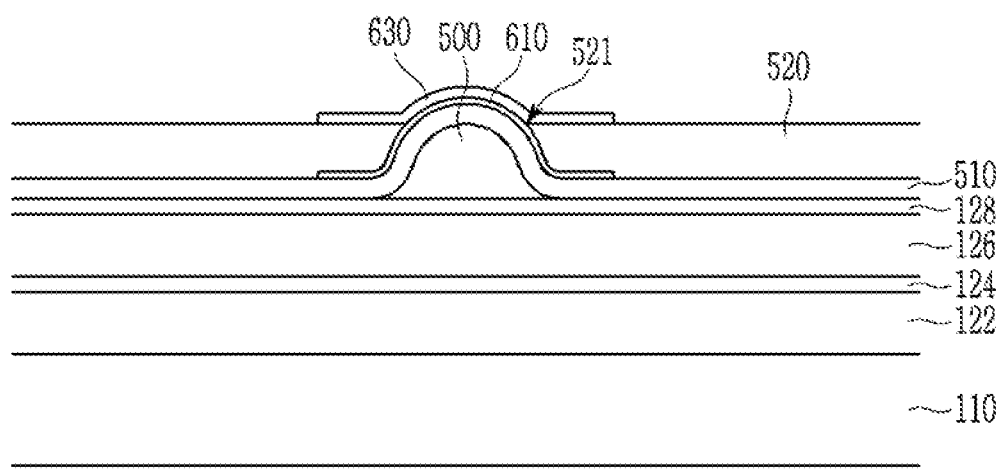

The description for the display device according to an exemplary embodiment shown in FIG. 18 to FIG. 20 may be omitted since the pattern structure for the display device according to an exemplary embodiment shown in FIG. 18 to FIG. 20 is substantially same as the pattern structure for the display device according to an exemplary embodiment shown in FIG. 14 to FIG. 17. In the present exemplary embodiment, the contact hole may be formed without the photomask, which may be different from the previous exemplary embodiment, and will be further described.

FIG. 18 to FIG. 20 are cross-sectional views showing a manufacturing method for a display device according to an exemplary embodiment of the present inventive concept.

As shown in FIG. 18, the protrusion pattern 500, the first conductive pattern 610, the interlayer insulating layer 520, etc. may be formed on the substrate 110. The interlayer insulating layer 520 may be formed by using the organic insulating material. The upper surface of the interlayer insulating layer 520 may be flat such that the part of the interlayer insulating layer 520 overlapping the protrusion pattern 500 may be thinner than the part of the interlayer insulating layer 520 that does not overlap the protrusion pattern 500.

In the previous exemplary embodiment, the photoresist may be formed on the interlayer insulating layer 520, and the interlayer insulating layer 520 may be etched by using the patterned photoresist as the mask after patterning the photoresist, however the photoresist is not used in the present exemplary embodiment.

If the interlayer insulating layer 520 is developed or etched, as shown in FIG. 19, the thickness of the entire interlayer insulating layer 520 may decrease. In this case, a relatively thin part of the interlayer insulating layer 520 may be removed. For example, the part of the interlayer insulating layer 520 overlapping the protrusion pattern 500 may be removed, and the part of the interlayer insulating layer 520 that does not overlap the protrusion pattern 500 may remain. The removed part of the interlayer insulating layer 520 may become the contact hole 521. The contact hole 521 may be positioned on the center part of the first conductive pattern 610. For example, the contact hole 521 may be positioned on the protruded part of the first conductive pattern 610.

As above-described, in the present exemplary embodiment, the contact hole 521 may be formed in the interlayer insulating layer 520 without using the photomask, and the problem due to the misalignment of the photomask may be solved. Also, in the present exemplary embodiment, the photoresist may not be formed, therefore the process time may be reduced and the processing cost may be reduced.

When measured in a direction perpendicular to the surface of the substrate, the maximum distance from the upper surface of the substrate 110 to the upper surface of the first conductive pattern 610 may be greater than the maximum distance from the upper surface of the substrate 110 to the upper surface of the interlayer insulating layer 520. In one embodiment, the diameter or the width of the contact hole 521 may be substantially the same as the diameter or the width of the protrusion pattern 500. The planar shape of the contact hole 521 may be substantially the same as the planar shape of the protrusion pattern 500.

As shown in FIG. 20, the second conductive pattern 630 may be formed on the interlayer insulating layer 520. The second conductive pattern 630 may be connected to the first conductive pattern 610 through the contact hole 521.

Next, the pattern structure for the display device according to an exemplary embodiment will be described with reference to FIG. 21.

Figure 21:
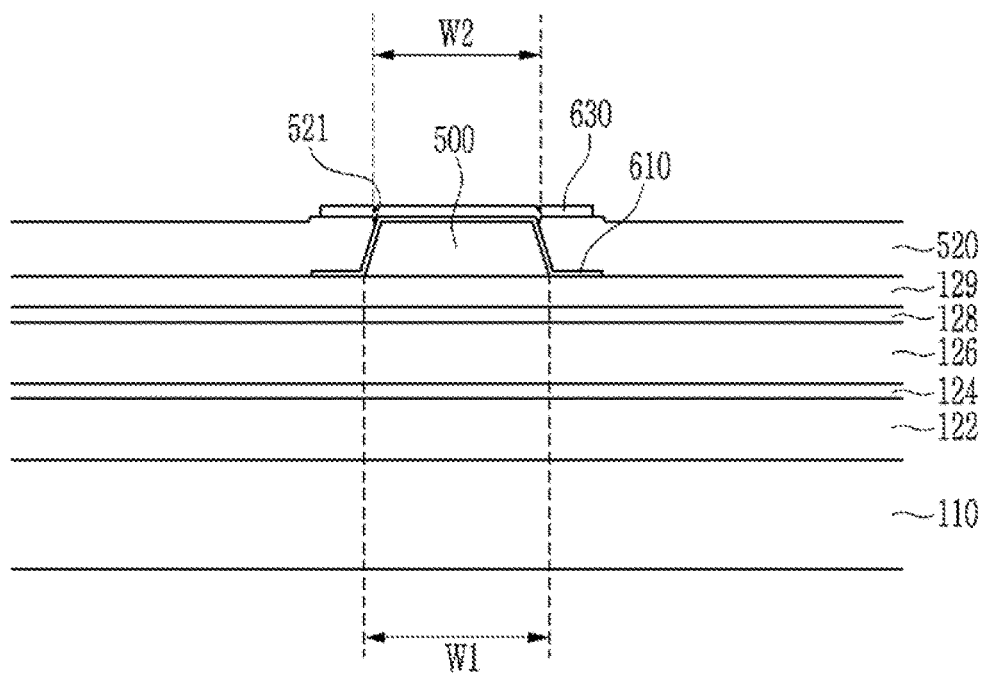
FIG. 21 is a cross-sectional view showing the pattern structure for the display device according to an exemplary embodiment of the present inventive concept.

The pattern structure for the display device according to an exemplary embodiment shown in FIG. 21 may be substantially similar to the pattern structure for the display device according to an exemplary embodiment shown in FIG. 1. Therefore, the overlapping description thereof may be omitted. In the present exemplary embodiment, the first conductive pattern may be positioned directly on the protrusion pattern, which may be different from the previous exemplary embodiment, and will be further described.

FIG. 21 is a cross-sectional view showing a pattern structure for a display device according to an exemplary embodiment of the present inventive concept.

Similar to the previous exemplary embodiment, the pattern structure for the display device according to an exemplary embodiment may include the substrate 110, the first conductive pattern 610 positioned on the substrate 110, and the protrusion pattern 500 positioned between the substrate 110 and the first conductive pattern 610. The interlayer insulating layer 520 including the contact hole 521 may be formed on the first conductive pattern 610, and the second conductive pattern 630 may be connected to the first conductive pattern 610 through the contact hole 521.

In the previous exemplary embodiment, the buffer layer is positioned between the protrusion pattern 500 and the first conductive pattern 610. On the other hand, according to the present exemplary embodiment, the buffer layer may not be positioned between the protrusion pattern 500 and the first conductive pattern 610. The first conductive pattern 610 may be positioned directly on the protrusion pattern 500 to be in contact with the protrusion pattern 500.

The protrusion pattern 500 may be made of the inorganic insulating material, the metal, the metal oxide, etc. The cross-sectional shape of the protrusion pattern 500 may include a trapezoidal shape. However, the embodiment is not limited thereto, and the shape of the protrusion pattern 500 may be changed.

The diameter or the width of the contact hole 521 may be substantially the same as the diameter or the width of the protrusion pattern 500. The planar shape of the contact hole 521 may be substantially the same as the planar shape of the protrusion pattern 500.

A buffer layer 129 may be further positioned between the protrusion pattern 500 and the second barrier layer 128. The buffer layer 129 may be made of the inorganic insulating material, for example, silicon oxide (SiOx), silicon nitride (SiNx), etc.

Next, the pattern manufacturing method for the display device according to an exemplary embodiment will be described with reference to FIG. 22 to FIG. 25.

FIG. 22 to FIG. 25 are cross-sectional views showing a manufacturing method for a display device according to an exemplary embodiment of the present inventive concept.

Figure 22:
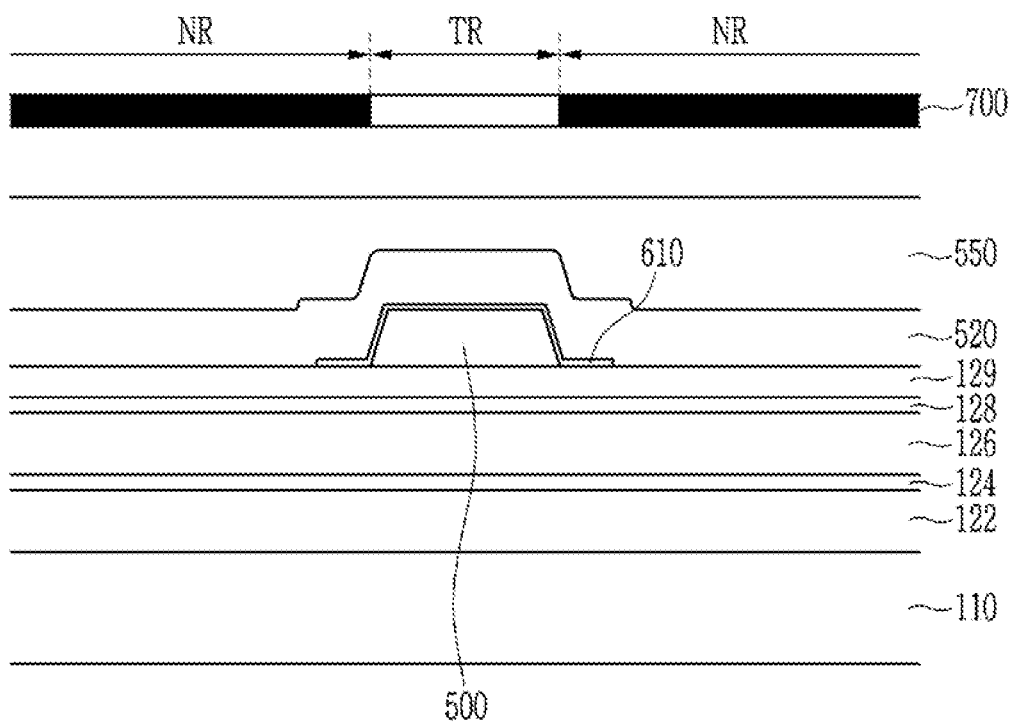
FIG. 22 to FIG. 25 are cross-sectional views showing a manufacturing method for a display device according to an exemplary embodiment of the present inventive concept.

As shown in FIG. 22, the first organic insulating layer 122, the first barrier layer 124, the second organic insulating layer 126, the second barrier layer 128, and the buffer layer 129 may be sequentially stacked on the substrate 110. In one embodiment, at least one of the first organic insulating layer 122, the first barrier layer 124, the second organic insulating layer 126, the second barrier layer 128, and the buffer layer 129 may be omitted.

The inorganic insulating material, the metal, the metal oxide, etc. may be formed and patterned on the buffer layer 129 to form the protrusion pattern 500. The protrusion pattern 500 may have the protrusion and depression shape extending from the upper surface of the second barrier layer 128. The cross-sectional shape of the protrusion pattern 500 may include the trapezoidal shape. However, the embodiment is not limited thereto, and the shape of the protrusion pattern 500 may be different in another embodiment.

In one embodiment, the conductive material may be formed on the protrusion pattern 500, and may be patterned to form the first conductive pattern 610. The conductive material may be made of the semiconductor material, for example, the amorphous semiconductor, the crystalline semiconductor, the oxide semiconductor, etc., or the metal, the metal oxide. etc.

The first conductive pattern 610 may be patterned to overlap the protrusion pattern 500. In one example, the first conductive pattern 610 may be formed to cover the entire upper surface of the protrusion pattern 500 as shown in FIG. 22. The first conductive pattern 610 positioned on the protrusion pattern 500 may be contoured with the protruded shape, depending on the shape of the protrusion pattern 500. Accordingly, when measured in a direction perpendicular to the upper surface of the substrate 110, the distance from the upper surface of the substrate 110 to the center part of the upper surface first conductive pattern 610 may be greater than the distance from the upper surface of the substrate 110 to the edge part of the upper surface of the first conductive pattern 610.

The interlayer insulating layer 520 may be formed on the first conductive pattern 610 and the buffer layer 129. The interlayer insulating layer 520 may be positioned directly on the first conductive pattern 610. The photoresist 550 may be coated on the interlayer insulating layer 520. The upper surface of the photoresist may be formed to be flat. Accordingly, the part of the photoresist 550 overlapping the protrusion pattern 500 may be thinner than the part that does not overlap the protrusion pattern 500.

The photomask 700 may be aligned on the photoresist 550 and the exposure process may be executed. The photomask 700 may include the non-transmission part NR and the transmission part TR, and the part of the photoresist 550 corresponding to the transmission part TR of the photomask 700 may be exposed to the light.

Figure 23:
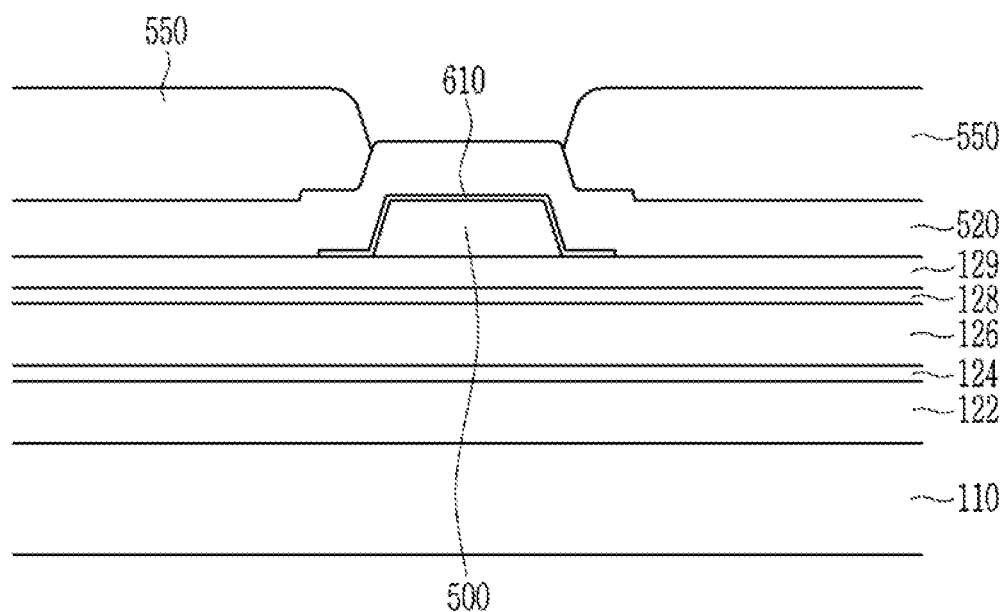

If the photoresist 550 that undergoes the exposure process is developed to be patterned, as shown in FIG. 23, the part of the photoresist 550 exposed to the light may be removed, and the part of the photoresist 550 that is not exposed to the light may remain.

Figure 24:
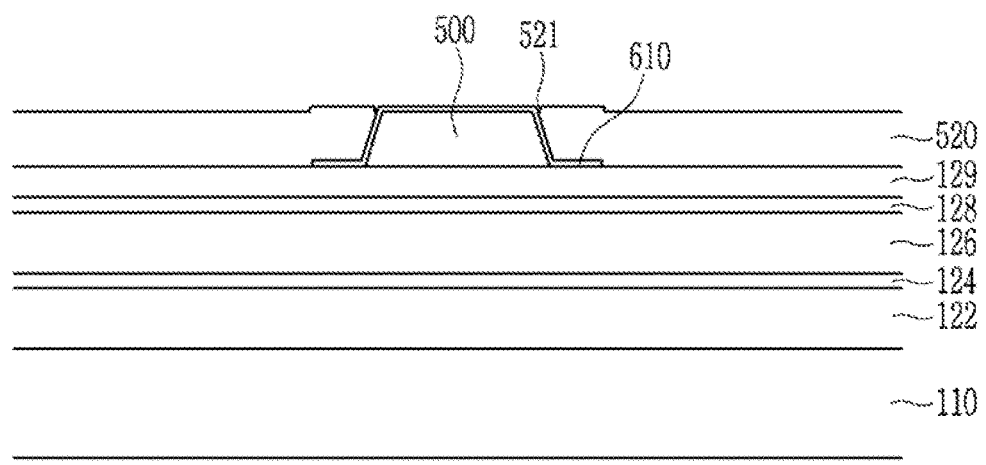

If the interlayer insulating layer 520 is etched by using the patterned photoresist 550 as a mask, as shown in FIG. 24, the contact hole 521 may be formed in the interlayer insulating layer 520. The contact hole 521 may expose at least part of the surface of the first conductive pattern 610. The contact hole 521 may be positioned on the center part of the first conductive pattern 610, for example, the protruded part of the first conductive pattern 610. The part of the interlayer insulating layer 520 covering the edge of the first conductive pattern 610 may remain.

Figure 25:
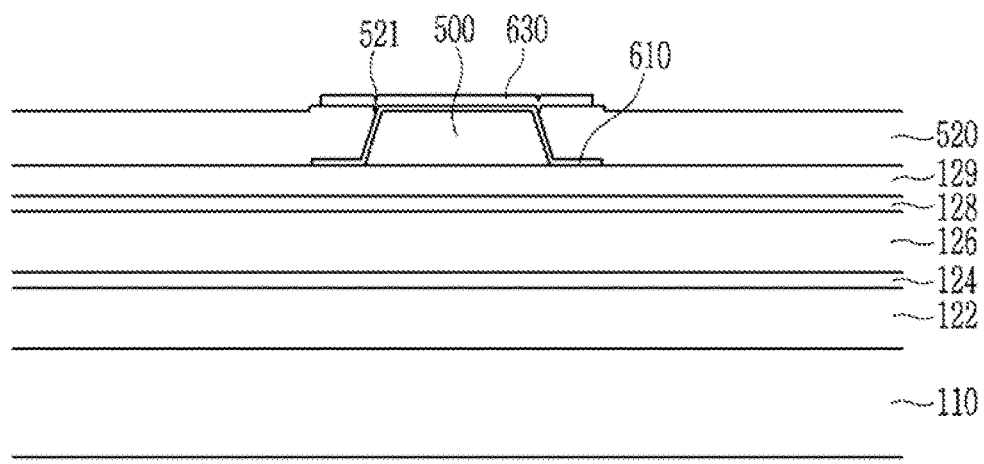

As shown in FIG. 25, the second conductive pattern 630 may be formed on the interlayer insulating layer 520. The second conductive pattern 630 may be connected to the first conductive pattern 610 through the contact hole 521.

In an exemplary embodiment of the present inventive concept, the photoresist may be formed, the photoresist is patterned by using the photomask, and the contact hole is formed by using the patterned photoresist. However, the embodiment is not limited thereto. In another exemplary embodiment, the photomask may not be used, and the photoresist may be developed without the exposure process for patterning the photoresist. Further, the contact hole may be formed by using the patterned photoresist. Also, the photoresist may not be formed and the interlayer insulating layer made of the organic insulating material may be patterned to form the contact hole.

Next, a display device including the pattern structure for the display device according to an exemplary embodiment will be described with reference to FIG. 26.

Figure 26:
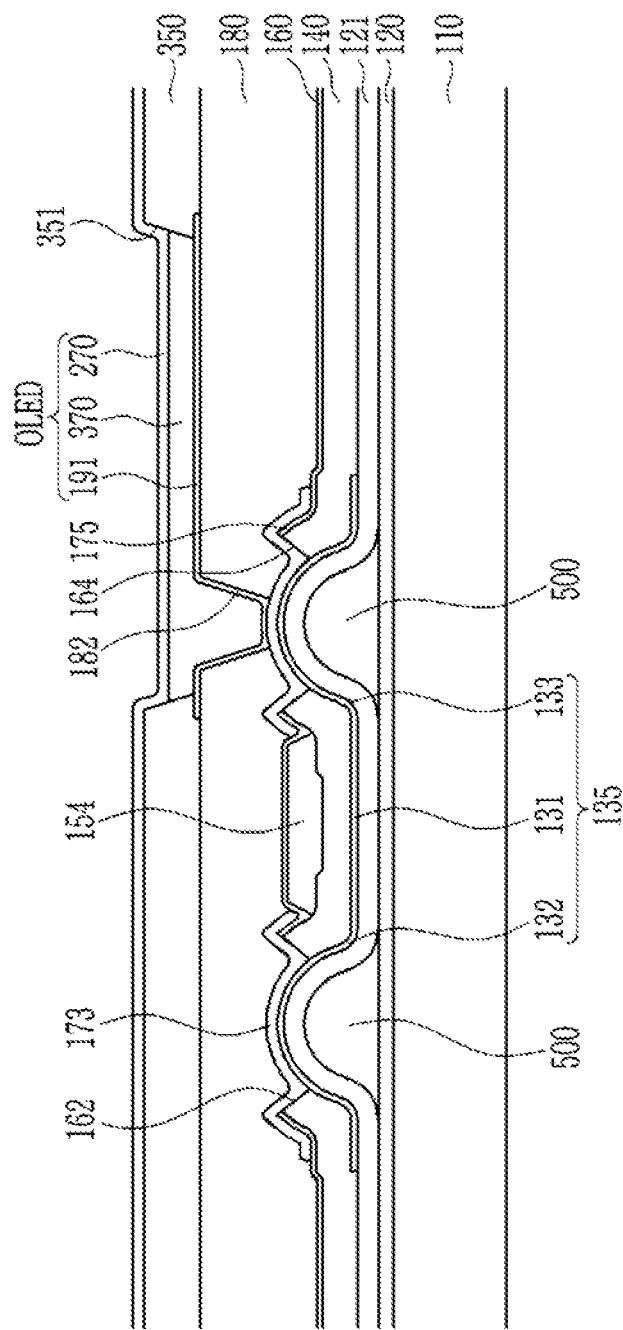
FIG. 26 is a cross-sectional view showing a display device including a pattern structure for a display device according to an exemplary embodiment of the present inventive concept.

FIG. 26 is a cross-sectional view showing a display device including a pattern structure for the display device according to an exemplary embodiment of the present inventive concept.

As shown in FIG. 26, the display device may include the protrusion pattern 500 positioned on the substrate 110, a semiconductor 135 positioned on the protrusion pattern 500, a source electrode 173 and a drain electrode 175 connected to the semiconductor 135, a first electrode 191 connected to the drain electrode 175, a second electrode 270 positioned on the first electrode 191, and an organic emission layer 370 positioned between the first electrode 191 and the second electrode 270.

The substrate 110 may be an insulating substrate made of glass, quartz, ceramic, plastic, etc., or a metal substrate made of stainless steel and the like. The substrate 110 may be flexible, stretchable, foldable, bendable, or rollable. As the substrate 110 may be flexible, stretchable, foldable, bendable, or rollable, the display device may also be flexible, stretchable, foldable, bendable, or rollable.

Buffer layers 120 and 121 may be further positioned between the substrate 110 and the protrusion pattern 500, and between the protrusion pattern 500 and the semiconductor 135, respectively. The buffer layers 120 and 121 may be formed as a single layer of silicon nitride (SiNx) or as a multilayer in which silicon nitride (SiNx) and silicon oxide (SiOx) are stacked. In one embodiment, the buffer layer 120 may be omitted.

Two protrusion patterns 500 may be positioned on the buffer layer 120. The protrusion patterns 500 may include the protrusion and depression shape extending from the upper surface of the buffer layer 120. The cross-section of the protrusion pattern 500 may be made to be semicircular. However, the embodiment is not limited thereto, and the shape of the protrusion pattern 500 may be different in another embodiment. For example, the protrusion pattern 500 may be made to be trapezoidal.

The protrusion pattern 500 may be made of the organic insulating material, for example, polyimide, etc. However, the embodiment is not limited thereto, and the protrusion pattern 500 may be made of the inorganic insulating material, the metal, the metal oxide, etc.

The semiconductor 135 may be positioned on the buffer layer 121. The semiconductor 135 may be made of the polycrystalline semiconductor material or the oxide semiconductor material. The semiconductor 135 may include a channel region 131 in which impurities are not doped, and contact doping regions 132 and 133 that are positioned at opposite sides of the channel region 131 and in which impurities are doped. The contact doping regions 132 and 133 may include a source region 132 and a drain region 133. Here, a type of the impurity may be changed depending on a type of a thin film transistor.

The source region 132 and the drain region 133 of the semiconductor 135 may be positioned on the protrusion pattern 500 and overlap the protrusion pattern 500. The semiconductor 135 may cover the entire upper surface of the protrusion pattern 500. The source region 132 and the drain region 133 of the semiconductor 135 may also be contoured with the protruded shape, depending on the shape of the protrusion pattern 500. Accordingly, when measured in a direction perpendicular to the upper surface of the substrate 110, the distance from the upper surface of the substrate 110 to the center part of the upper surface of the source region 132 of the semiconductor 135 may be greater than the distance from the upper surface of the substrate 110 to an edge part of the upper surface of the source region 132 of the semiconductor 135. Also, the distance from the upper surface of the substrate 110 to the center part of the upper surface of the drain region 133 of the semiconductor 135 may be greater than the distance from the upper surface of the substrate 110 to the edge part of the upper surface of the drain region 133 of the semiconductor 135.

A gate insulating layer 140 may be positioned on the semiconductor 135 and the buffer layer 121. The gate insulating layer 140 may be made of the inorganic insulating material, for example, silicon nitride (SiNx) or silicon oxide (SiOx), etc.

A gate electrode 154 may be positioned on the gate insulating layer 140. In this case, the gate electrode 154 may overlap at least part of the semiconductor 135. For example, the gate electrode 154 may overlap the channel region 131.

In one example, the gate electrode 154 may not overlap the protrusion pattern 500. The gate electrode 154 may overlap a region between two protrusion patterns 500.

An interlayer insulating layer 160 may be positioned on the gate electrode 154 and the gate insulating layer 140. The interlayer insulating layer 160 may be made of the inorganic insulating material or the organic insulating material.

The gate insulating layer 140 and the interlayer insulating layer 160 may include contact holes 162 and 164 overlapping at least part of the semiconductor 135. In one example, the contact holes 162 and 164 may be positioned on the source region 132 and the drain region 133 of the semiconductor 135 to expose at least part of the upper surface of the source region 132 and the drain region 133. The contact hole 162 may be positioned on the center part of the source region 132 of the semiconductor 135, for example, the protruded part of the source region 132. The contact hole 164 may be positioned on the center part of the drain region 133 of the semiconductor 135, for example, the protruded part of the drain region 133. The interlayer insulating layer 160 may cover the edge of the source region 132 and the edge of the drain region 133.

The diameter or the width of the contact holes 162 and 164 may be substantially the same as the diameter or the width of the protrusion pattern 500. The planar shape of the contact holes 162 and 164 may be substantially the same as the planar shape of the protrusion pattern 500.

The source electrode 173 and the drain electrode 175 may be positioned on the interlayer insulating layer 160. Further, the source electrode 173 and the drain electrode 175 may be respectively connected to the source region 132 and the drain region 133 of the semiconductor 135 through the contact holes 162 and 164. The source electrode 173 may be in contact with the center part of the source region 132 of the semiconductor 135, for example, the protruded part of the source region 132. The drain electrode 175 may be in contact with the center part of the drain region 133 of the semiconductor 135, for example, the protruded part of the drain region 133.

As above-described, a thin film transistor may include the semiconductor 135, the gate electrode 154, the source electrode 173, and the drain electrode 175. The configuration of the thin film transistor is not limited to the above-described examples, and may be different in another embodiment which is a known configuration, and which may be easily performed by those skilled in the art. The organic light emitting diode display may include a switching transistor and a driving transistor, and the above-described thin film transistor may be the driving transistor. Although not shown, however, a switching thin film transistor may be further included.

A passivation layer 180 may be positioned on the thin film transistor and the interlayer insulating layer 160. The passivation layer 180 may serve to remove and flatten steps, thereby increasing luminous efficiency of the organic light emitting diode display to be formed thereon. Further, the passivation layer 180 may include a contact hole 182 overlapping at least part of the drain electrode 175.

The passivation layer 180 may be made of polyacrylate resin, epoxy resin, phenolic resin, polyamide resin, polyimide resin, unsaturated polyester resin, polyphenylene resin, polyphenylene sulfide resin, or benzocyclobutene (BCB).

The first electrode 191 may be positioned on the passivation layer 180. The first electrode 191 may be made of a transparent conductive material such as indium tin oxide (ITO), indium zinc oxide (IZO), zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The first electrode 191 may be electrically connected to the drain electrode 175 of the thin film transistor through the contact hole 182 provided in the passivation layer 180 to be an anode of the organic light emitting diode (OLED).

Although not illustrated, the first electrode 191 may include first and second transparent electrodes including the transparent conductive material, and a semi-transmissive layer positioned between the first and second transparent electrodes to form a microcavity together with the second electrode 270. For example, the first electrode 191 may be formed as a multilayer including a layer made of the transparent conductive material and a layer made of a reflective metal.

A pixel defining layer 350 may be positioned on the passivation layer 180 and on an edge part of the first electrode 191. The pixel defining layer 350 may include a pixel opening 351 that does not cover the first electrode 191. The pixel defining layer 350 may include a resin such as polyacrylate resin and polyimide resin, or silica-based inorganic material.

The organic emission layer 370 may be positioned on the first electrode 191. The organic emission layer 370 may include at least one of an emission layer, a hole-injection layer (HIL), a hole-transporting layer (HTL), an electron-transporting layer (ETL), and an electron-injection layer (EIL).

The organic emission layer 370 may include one of a red organic emission layer for emitting red light, a green organic emission layer for emitting green light, and a blue organic emission layer for emitting blue light. The red organic emission layer, the green organic emission layer, and the blue organic emission layer may be respectively positioned at different pixels to implement a color image by a combination thereof.

Alternatively, the organic emission layer 370 may have a structure in which the red organic emission layer, the green organic emission layer, and the blue organic emission layer are respectively stacked on corresponding pixels. In this case, a color image may be implemented by forming a red filter, a green filter, or a blue filter for each pixel. In another example, by forming a white organic emission layer for emitting white light at each pixel and by forming a red filter, a green filter, and a blue filter for each pixel, it is possible to implement the color image. When the color image is implemented by using the white organic emission layer and the color filter, a deposition mask for respectively depositing the red organic emission layer, the green organic emission layer, and the blue organic emission layer on each corresponding pixel, for example, on the red pixel, on the green pixel, and the blue pixel, may not be required.

The white organic emission layer described in another example may be formed as a single organic emission layer, and may be formed as a plurality of organic emission layers stacked so that the white light may be emitted. For example, a structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer may be included.

The second electrode 270 may be positioned on the organic emission layer 370 and the pixel defining layer 350. The second electrode 270 may be made of the transparent conductive material such as indium tin oxide (ITO), indium zinc oxide (IZO), zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 may serve as a cathode of the organic light emitting diode (OLED). The first electrode 191, the organic emission layer 370, and the second electrode 270 may form the organic light emitting diode (OLED).

An encapsulation layer (not shown) protecting the organic light emitting diode (OLED) may be further positioned on the second electrode 270. The encapsulation layer may include an inorganic layer and an organic layer that are alternately stacked.

Hereinafter, it will be described how the above-mentioned protrusion pattern is specifically applied to the pixel of the organic light emitting display device. For this, a pixel circuit, operation thereof, and a pixel structure of the organic light emitting diode display according to an exemplary embodiment will be described in detail.

Figure 27:
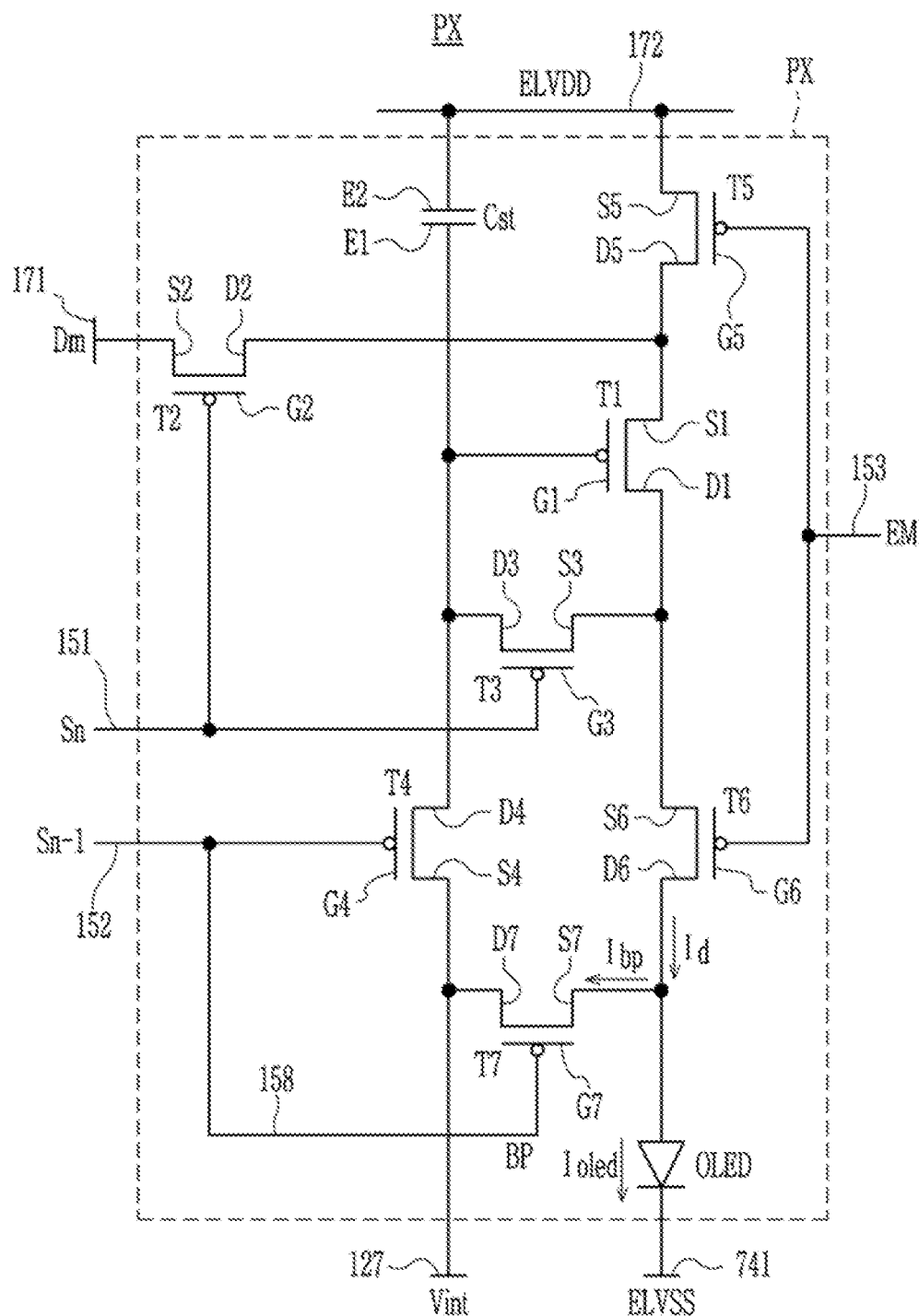
FIG. 27 is an equivalent circuit diagram of one pixel of an organic light emitting diode display according to an exemplary embodiment.
Figure 28:
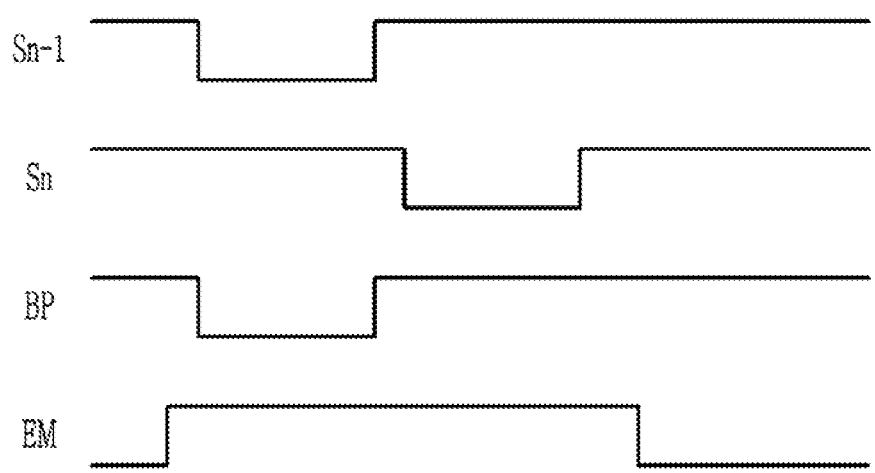
FIG. 28 is a timing diagram of signals applied to one pixel of an organic light emitting diode display according to an exemplary embodiment.

FIG. 27 is an equivalent circuit diagram of one pixel of an organic light emitting diode display according to an exemplary embodiment, and FIG. 28 is a timing diagram of signals applied to one pixel of an organic light emitting diode display according to an exemplary embodiment.

Referring to FIG. 27, a pixel PX according to the organic light emitting diode display includes transistors T1, T2, T3, T4, T5, T6, and T7, a storage capacitor Cst, and an organic light emitting diode (OLED) connected to various signal lines 127, 151, 152, 153, 158, 171, and 172. Although not shown, the organic light emitting diode display includes a display area (corresponding to a screen) on which an image is displayed, and the pixels PX are arranged, for example, in a matrix on the display area.

The transistors T1-T7 include a driving transistor T1 and a switching transistor T2, and may further include a compensation transistor T3, an initialization transistor T4, an operation control transistor T5, a light emission control transistor T6, and a bypass transistor T7.

The signal lines 127, 151, 152, 153, 158, 171, and 172 may include a scan line 151, a previous scan line 152, a light emission control line 153, a bypass control line 158, a data line 171, a driving voltage line 172, and an initialization voltage line 127. The bypass control line 158 may be a part of the previous scan line 152.

The scan line 151 is connected to a gate driver (not shown) to transmit a scan signal Sn to the switching transistor 12 and the compensation transistor T3. The previous scan line 152 is connected to the gate driver to transmit a previous scan signal S(n−1) to the initialization transistor T4. The light emission control line 153 is connected to a light emission controller (not shown) to transmit a light emission control signal (EM) to the operation control transistor T5 and the light emission control transistor T6. The bypass control line 158 transmits a bypass signal BP to the bypass transistor T7.

The data line 171 transmits a data signal Dm generated in the data driver (not shown) and the driving voltage line 172 transmits the driving voltage ELVDD. The initialization voltage line 127 transmits an initialization voltage Vint initializing the driving transistor T1.

The driving transistor T1 is connected to a first storage electrode E1 of the storage capacitor Cst. A source electrode S1 of the driving transistor T1 is connected to the driving voltage line 172 via the operation control transistor T5. A drain electrode D1 of the driving transistor T1 is connected to an anode of the organic light emitting diode OLED via the light emission control transistor T6. The driving transistor T1 receives the data signal Dm depending on the switching operation of the switching transistor T2 to supply a driving current Id to the organic light emitting diode OLED.

The switching transistor T2 includes a gate electrode G2 connected to the scan line 151 and a source electrode S2 connected to the data line 171. The drain electrode D2 of the switching transistor T2 is connected to the source electrode S1 of the driving transistor T1 and is connected to the driving voltage line 172 via the operation control transistor T5. If the switching transistor T2 is turned on depending on the scan signal Sn transmitted through the scan line 151, the data signal Dm transmitted through the data line 171 is transmitted to the source electrode S1 of the driving transistor T1.

The compensation transistor T3 includes a gate electrode G3 connected to the scan line 151 and a source electrode S3 connected to the drain electrode D1 of the driving transistor T1 and the source electrode S6 of the light emission control transistor T6. A drain electrode D3 of the compensation transistor T3 is connected to the drain electrode D4 of the initialization transistor T4, the first storage electrode E1 of the storage capacitor Cst, and the gate electrode G1 of the driving transistor T1. If the compensation transistor T3 is turned on depending on the scan signal Sn transmitted through the scan line 151, the gate electrode G1 and the drain electrode D1 of the driving transistor T1 are connected, that is, the driving transistor T1 is diode-connected.

The initialization transistor T4 includes the gate electrode G4 connected to the previous scan line 152 and the source electrode S4 connected to the initialization voltage line 127. The drain electrode D4 of the initialization transistor T4 is connected to the first storage electrode E1 of the storage capacitor Cst and the gate electrode G1 of the driving transistor T1 via the drain electrode D3 of the compensation transistor T3. The initialization transistor T4 is turned on depending on the previous scan signal S(n−1) transmitted through the previous scan line 152 such that the initialization voltage Vint is transmitted to the gate electrode G1 of the driving transistor T1. Accordingly, the gate voltage of the gate electrode G1 of the driving transistor T1 is initialized.

The operation control transistor T5 includes a gate electrode G5 connected to the light emission control line 153 and a source electrode S5 connected to the driving voltage line 172. A drain electrode D5 of the operation control transistor T5 is connected to the source electrode S1 of the driving transistor T1 and the drain electrode D2 of the switching transistor T2. The light emission control transistor T6 includes a gate electrode G6 connected to the light emission control line 153 and a drain electrode D6 connected to the anode of the organic light emitting diode OLED. The source electrode S6 of the light emission control transistor T6 is connected to the drain electrode D1 of the driving transistor T1 and the source electrode S3 of the compensation transistor T3. The operation control transistor T5 and the light emission control transistor T6 are simultaneously turned on depending on the light emission control signal (EM) transmitted through the light emission control line 153, and accordingly the driving voltage ELVDD is compensated through the diode-connected driving transistor T1 to be transmitted to the organic light emitting diode OLED.

The bypass transistor T7 includes a gate electrode G7 connected to the bypass control line 158, a source electrode S7 connected to the drain electrode D6 of the light emission control transistor T6 and the anode of the organic light emitting diode OLED, and a drain electrode D7 connected to the initialization voltage line 127 and the source electrode S4 of the initialization transistor T4. Since the bypass control line 158 is connected to the previous scan line 152, the bypass signal BP is the same as the previous scan signal S(n−1). The bypass control line 158 may not be connected to the previous scan line 152 to transmit a separate signal from the previous scan signal S(n−1).

A second storage electrode E2 of the storage capacitor Cst is connected to the driving voltage line 172. The cathode of the organic light emitting diode OLED is connected to a common voltage line 741 transmitting a common voltage ELVSS.

In the exemplary embodiment of FIG. 27, the pixel circuit includes seven transistors T1 to T7 and one capacitor Cst, however it is not limited thereto, and a number of transistors and a number of capacitors, and the connection thereof, may be variously changed.

The operation of one pixel of the organic light emitting diode display according to an exemplary embodiment will now be described with reference to FIG. 27 and FIG. 28.

The previous scan signal S(n−1) of a low level is supplied to the pixel PX through the previous scan line 152 during an initialization period. Thus, the initialization transistor T4 is turned on depending on the previous scan signal S(n−1) of a low level and the initialization voltage Vint is applied to the gate electrode G1 of the driving transistor T1 from the initialization voltage line 127 through the initialization transistor T4, and accordingly the driving transistor T1 is initialized by the initialization voltage Vint.

Next, the scan signal Sn of a low level is supplied to the pixel PX through the scan line 151 during a data programming period. Thus, the switching transistor T2 and the compensation transistor T3 are turned on depending on the scan signal Sn of a low level, and the driving transistor T1 is diode-connected by the turned-on compensation transistor T3 and is biased in a forward direction. Accordingly, a compensation voltage (Dm+Vth, where Vth is a negative value) that is decreased by a threshold voltage Vth of the first transistor T1 from the data signal Dm transmitted through the data line 171 is applied to the gate electrode G1 of the first transistor T1. The driving voltage ELVDD and the compensation voltage (Dm+Vth) are respectively applied to the first and second storage electrodes E1 and E2 of the storage capacitor Cst, and the storage capacitor Cst may be charged with a charge corresponding to a voltage difference between the first and second storage electrodes E1 and E2.

Next, the light emission control signal EM supplied from the light emission control line 153 is changed from high level to low level, and the operation control transistor T5 and the light emission control transistor T6 are turned on by the light emission control signal EM of a low level during the light emission period. Thus, a driving current Id depending on the voltage difference between the gate voltage of the gate electrode G1 of the driving transistor T1 and the driving voltage ELVDD is generated, and the driving current Id is supplied to the organic light emitting diode OLED through the light emission control transistor T6. The gate-source voltage Vgs of the driving thin film transistor T1 is maintained as "(Dm+Vth)−ELVDD" by the storage capacitor Cst for the emission period, and according to a current-voltage relationship of the driving thin film transistor T1, the driving current Id is proportional to the square "(Dm−ELVDD)$^2$" of a value obtained by subtracting the threshold voltage from the source-gate voltage. Accordingly, the driving current id is determined regardless of the threshold voltage Vth of the driving thin film transistor T1, and for example, non-uniformity of the characteristic of the driving transistor T1 due to process distribution may be improved.

The bypass transistor T7 disperses a part of a minimum current (i.e., because the gate-source voltage Vgs of the driving transistor T1 is smaller than the threshold voltage Vth, a current in a condition that the driving transistor T1 is turned off) of the driving transistor T1 as a bypass current Ibp to a current path other than the current path on the organic light emitting diode side. Accordingly, a black gray scale may be further correctly displayed and a contrast ratio may be improved. In FIG. 27, the bypass signal BP is the same as the previous scan signal S(n−1), however they may be different from each other.

Figure 29:
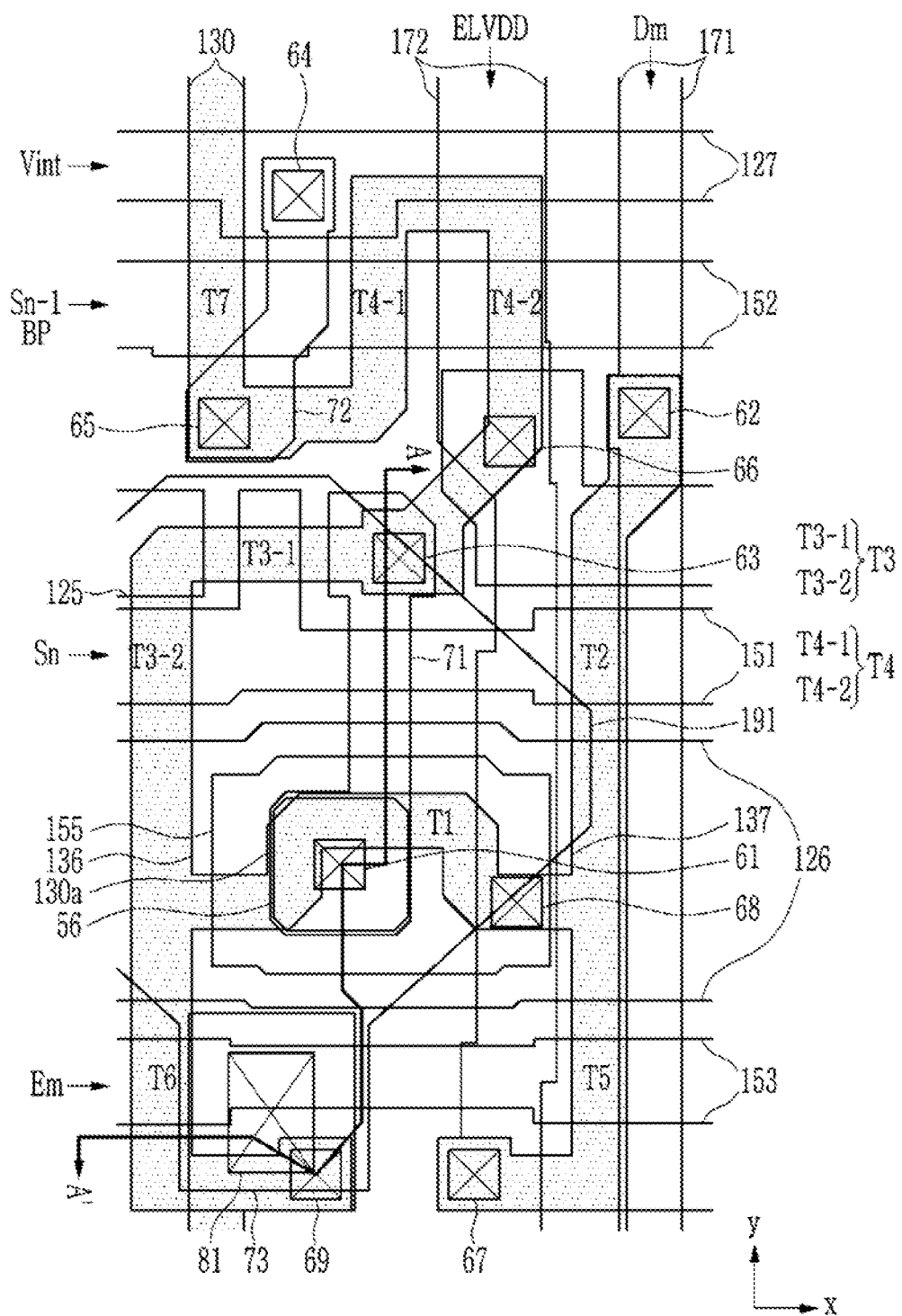
FIG. 29 is a layout view of one pixel area of an organic light emitting diode display according to an exemplary embodiment.
Figure 30:
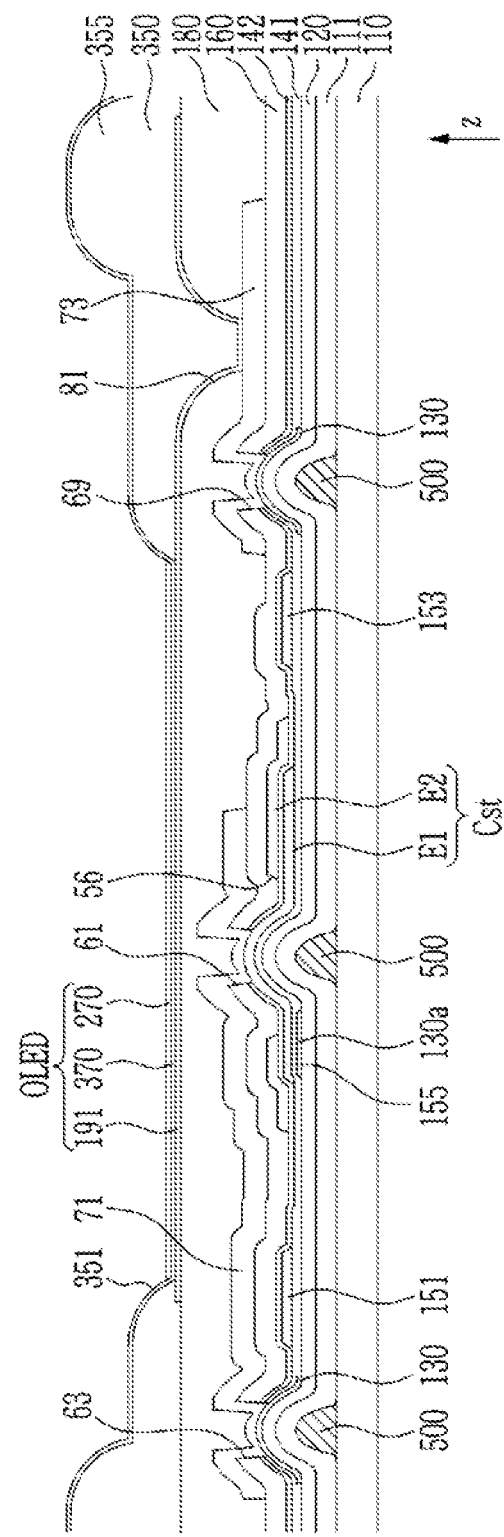
FIG. 30 to FIG. 32 are cross-sectional views taken along a line A-A' in FIG. 29 according to an exemplary embodiment.
Figure 31:
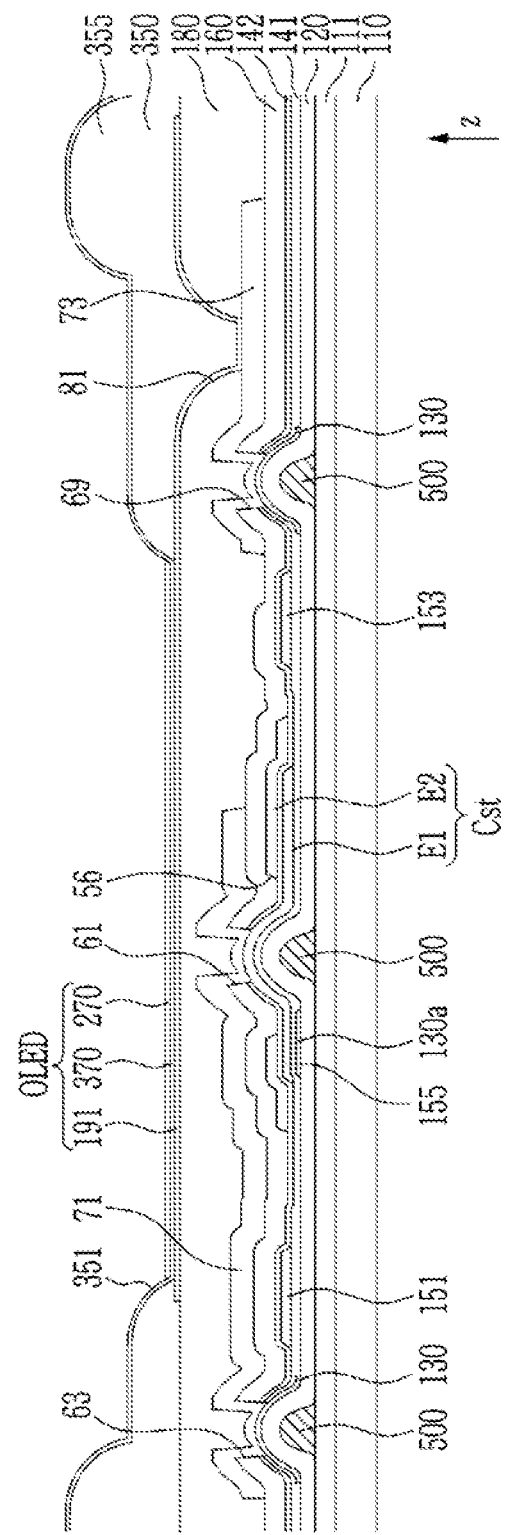
Figure 32:
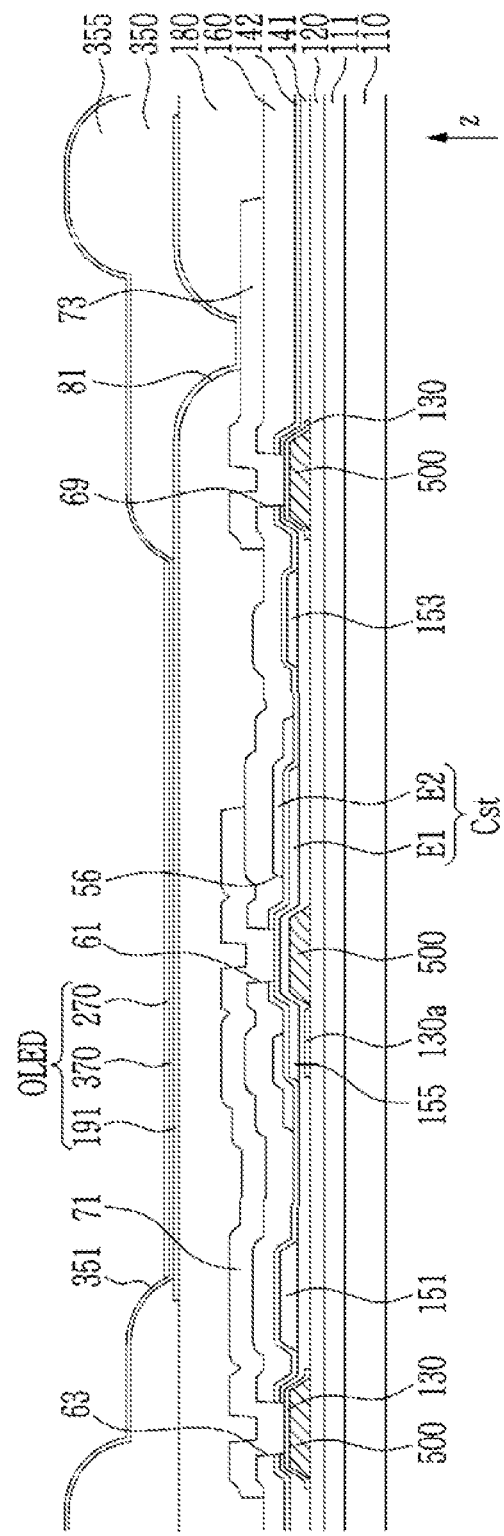

FIG. 29 is a layout view of one pixel area of an organic light emitting diode display according to an exemplary embodiment, and FIG. 30 to FIG. 32 are cross-sectional views taken along a line A-A' in FIG. 29 according to an exemplary embodiment.

Referring to FIG. 29 and FIG. 30, the organic light emitting diode display according to an exemplary embodiment includes the scan line 151, the previous scan line 152, the light emission control line 153, and the initialization signal line 127 mainly extending along the first direction x and respectively transmitting the scan signal Sn, the previous scan signal S(n−1), the light emission control signal (EM), and the initialization voltage Vint. The bypass signal BP is transmitted through the previous scan line 152. The organic light emitting diode display includes the data line 171 and the driving voltage line 172 mainly extending along the second direction y crossing the first direction x and respectively transmitting the data signal Dm and the driving voltage ELVDD.

The organic light emitting diode display includes the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED. The organic light emitting diode OLED is formed of a first electrode 191, an organic emission layer 370, and a second electrode 270. The compensation transistor T3 and the initialization transistor T4 may have a dual gate structure to prevent a leakage current, that is, a structure in which a first compensation transistor T3-1 and a second compensation transistor T3-2 are connected, and a first initialization transistor T4-1 and a second initialization transistor T4-2 are connected.

Each of the channel, the source electrode, and the drain electrode of the driving transistor T1, the switching transistor T2, the compensation transistor T3, the initialization transistor T4, the operation control transistor T5, the light emission control transistor T6, and the bypass transistor T7 is positioned within one semiconductor layer 130 extending to be elongated. The semiconductor layer 130 may be formed to be curved in various shapes. The semiconductor layer 130 may include a polycrystalline semiconductor such as polysilicon or an oxide semiconductor.

The semiconductor layer 130 includes a channel region that is doped with an N-type impurity or a P-type impurity, and a source doping region and a drain doping region positioned at respective sides of the channel region and having a higher doping concentration than the channel region. The source doping region and the drain doping region correspond to the source electrode and the drain electrode of each of the transistors T1 to T7. Also, in the semiconductor layer 130, a region between the source electrode and the drain electrode of the different transistors may be doped such that the source electrode of one transistor and the drain electrode of the other transistor may be electrically connected to each other.

Each channel of the transistors T1 to T7 overlaps the gate electrode of each of the transistors T1 to T7 and is positioned between the source electrode and the drain electrode of the transistors T1 to T7. The transistors T1 to T7 may have substantially the same stacked structure. Accordingly, the driving transistor T1 is mainly described in detail, and the rest of the transistors T2 to T7 are schematically described.

The driving transistor T1 includes a channel 130a, a gate electrode 155, a source electrode 136, and a drain electrode 137. The channel 130a overlaps the gate electrode 155 between the source electrode 136 and the drain electrode 137. The channel 130a may be curved, thereby forming the channel 130a to be elongated in restricted limited region. As the length of the channel 130a is elongated, a driving range of the gate voltage Vg applied to the gate electrode 155 of the driving transistor T1 is increased. Since the driving range of the gate voltage is increased, a gray scale of light emitted from the organic light emitting diode OLED may be finely controlled by changing the magnitude of the gate voltage, and as a result, the resolution of the organic light emitting diode display device may be enhanced and display quality may be improved. Also, since the channel 130a does not extend in one direction, but extends in various directions, the influence on the directionality in the manufacturing process is canceled out and the influence of the process dispersion may be reduced. Accordingly, a display quality deterioration such as a stain defect (e.g., generation of a luminance difference for varying pixels even if the same data signal Dm is applied) due to a characteristic change of the driving transistor T1 according to the region of the display device by the process dispersion may be prevented. The shape of the channel 130a is not limited to the shown "Ω" shape, and thus various shapes such as 'reverse S', 'S', 'M', 'W', and the like are possible.

The gate electrode 155 overlaps the channel 130a. The source electrode 136 and the drain electrode 137 are adjacent to respective sides of the channel 130a. A first data connecting member 71 is connected to the gate electrode 155 through a contact hole 61. For this connection, an opening 56 through which the first data connecting member 71 may penetrate is formed in the second storage electrode E2 of the storage capacitor Cst.

The gate electrode of the switching transistor T2 may be a part of the scan line 151. The data line 171 is connected to the source electrode of the switching transistor T2 through a contact hole 62.

The compensation transistor T3 includes a first compensation transistor T3-1 and a second compensation transistor T3-2 adjacent to each other. The gate electrode of the first compensation transistor T3-1 may be a part of the scan line 151. The source electrode of the first compensation transistor T3-1 is connected to the source electrode of the light emission control transistor T6 and the drain electrode of the driving transistor T1.

The source electrode of the second compensation transistor T3-2 is connected to the drain electrode of the first compensation transistor T3-1. The gate electrode of the second compensation transistor T3-2 may be a protrusion of the scan line 151. The first data connecting member 71 is connected to the drain electrode of the second compensation transistor T3-2 through a contact hole 63.

The initialization transistor T4 includes the first initialization transistor T4-1 and the second initialization transistor T4-2. The gate electrode of the first initialization transistor T4-1 and the gate electrode of the second initialization transistor T4-2 may be a part of the previous scan line 152. A second data connecting member 72 is connected to the source electrode of the first initialization transistor T4-1 through a contact hole 65. The first data connecting member 71 is connected to the drain electrode of the second initialization transistor T4-2 is connected through the contact hole 63. The drain electrode of the first initialization transistor T4-1 is connected to the source electrode of the second initialization transistor T4-2. The first data connecting member 71 is connected to the drain electrode of the second initialization transistor T4-2 through the contact hole 63.

As above-described, as the first and second compensation transistors T3-1 and T3-2 are formed as the compensation transistor T3 and the first and second initialization transistors T4-1 and T4-2 are formed as the initialization transistor T4, an electron moving path of the channel is blocked in an off state, thereby effectively preventing the leakage current from being generated.

The gate electrode of the operation control transistor T5 may be a part of the light emission control line 153. The driving voltage line 172 is connected to the source electrode of the operation control transistor T5 through a contact hole 67.

The gate electrode of the light emission control transistor T6 may be a part of the light emission control line 153. A third data connecting member 73 is connected to the drain electrode of the light emission control transistor T6 through a contact hole 69.

The gate electrode of the bypass transistor T7 may be a part of the previous scan line 152. The third data connecting member 73 is connected to the source electrode of the bypass transistor T7 through s contact hole 81. The drain electrode of the bypass transistor T7 is connected to the source electrode of the first initialization transistor T4-1.

The storage capacitor Cst includes a first storage electrode E1 and a second storage electrode E2 overlapping via a second gate insulating layer 142. The first storage electrode E1 corresponds to the gate electrode 155 of the driving transistor T1, and the second storage electrode E2 may be an expanded part of a storage line 126. Here, the second gate insulating layer 142 becomes a dielectric material, and a capacitance is determined by the charges charged in the storage capacitor Cst and the voltage between the first and second storage electrodes E1 and E2. As described above, by using the gate electrode 155 as the first storage electrode E1, a space for forming the storage capacitor Cst may be obtained in the space that is decreased by the channel 130a of the driving transistor T1 occupying a large area in the pixel.

One end of the first data connecting member 71 is connected to the first storage electrode E1 of the gate electrode 155 through the contact hole 61 and the opening 56. The opening 56 is formed in the second storage electrode E2. The other end of the first data connecting member 71 is connected to the drain electrode of the second compensation transistor T3-2 and the drain electrode of the second initialization transistor T4-2 through the contact hole 63. Accordingly, the first data connecting member 71 connects the gate electrode 155 of the driving transistor T1 to the drain electrode of the second compensation transistor T3-2 and the drain electrode of the second initialization transistor T4-2.

The driving voltage line 172 is connected to the second storage electrode E2 through a contact hole 68. Accordingly, the storage capacitor Cst stores the charges corresponding to the driving voltage ELVDD transmitted to the second storage electrode E2 through the driving voltage line 172 and the gate voltage Vg of the gate electrode 155.

The second data connecting member 72 is connected to initialization voltage line 127 through a contact hole 64. The first electrode 191 that is referred to as a pixel electrode is connected to the third data connecting member 73 through the contact hole 81.

A parasitic capacitor control pattern 125 may be located at both sides of the gate electrode of the second compensation transistor T3-2. When a parasitic capacitor exists in the pixel, if the voltage applied to the parasitic capacitor is changed, the display quality characteristic may be changed. The driving voltage line 172 is connected to the parasitic capacitor control pattern 125 through a contact hole 66. Accordingly, as the driving voltage ELVDD of a constant DC voltage is applied to the parasitic capacitor, the display quality characteristic may be prevented from being changed. The parasitic capacitor control pattern 125 may be located in a different region from that shown in the FIG. 29 and a voltage other than the driving voltage ELVDD may be applied.

A cross-sectional structure of the organic light emitting diode display according to an exemplary embodiment will now be described depending on a stacking order with reference to FIG. 30. Even without special mention, FIG. 29 is also referred to.

Protrusion patterns 500 are positioned at the positions respectively corresponding to the contact holes 61 to 69 on a substrate 110. Each of the contact holes 61 to 69 overlaps the corresponding protrusion pattern 500. The protrusion patterns 500 may only be positioned corresponding to the part among the contact holes 61 to 69. The protrusion patterns 500 have a shape that is protruded from the upper surface of the substrate 110 in a third direction z. The cross-section of the protrusion patterns 500 may be approximately semicircular or half oval. The protrusion patterns 500 may be formed of an organic insulating material such as polyimide. The protrusion patterns 500 may be made of an inorganic insulating material, a metal material, a metal oxide, and the like. The substrate 110 is a flexible substrate made of plastic, or may be a rigid substrate made of glass, quartz, ceramic, and the like.

A barrier layer 111 covering the protrusion patterns 500 is positioned on the substrate 110, and a buffer layer 120 is positioned on the barrier layer 111. The barrier layer 111 serves a function of preventing an impurity that may degrade the characteristic of the semiconductor from being diffused, penetration of moisture, and the like. The buffer layer 120 serves a function of preventing the impurity that may be diffused from the substrate 110 to the semiconductor layer 130 in the process of forming the semiconductor layer 130 and reducing stress applied to the substrate 110. The barrier layer 111 and the buffer layer 120 may include an inorganic insulating material such as a silicon oxide, a silicon nitride, and the like. When the substrate 110 is a flexible substrate, the substrate 110 has a multi-layered structure including a plastic layer, a barrier layer, and a plastic layer. When the substrate 110 is a rigid substrate such as a glass substrate, the organic light emitting diode display may not include the barrier layer 111.

Differently from the shown exemplary embodiment, the protrusion patterns 500 may be positioned between the barrier layer 111 and the buffer layer 120, or may be positioned between the buffer layer 120 and the semiconductor layer 130.

The semiconductor layer 130 including the channel, the source electrode, and the drain electrode of the transistors T1 to T7 is positioned on the buffer layer 120.

A first gate insulating layer 141 covering the semiconductor layer 130 is positioned on the semiconductor layer 130. A first gate conductor including the gate electrodes of the transistors T1 to T7, the scan line 151, the previous scan line 152, the light emission control line 153, and the first storage electrode E1 is positioned on the first gate insulating layer 141.

The second gate insulating layer 142 covering the first gate conductor is positioned on the first gate conductor. The first gate insulating layer 141 and the second gate insulating layer 142 may be formed of a silicon nitride, a silicon oxide, and the like.

A second gate conductor including the storage line 126, the second storage electrode E2, and the initialization voltage line 127 is positioned on the second gate insulating layer 142.

An interlayer insulating layer 160 covering the second gate conductor is positioned on the second gate conductor. The interlayer insulating layer 160 may be formed of a silicon nitride, a silicon oxide, and the like, or the organic insulating material. The contact holes 61 to 69 are formed in the interlayer insulating layer 160.

A data conductor including the data line 171, the driving voltage line 172, the first data connecting member 71, the second data connecting member 72, and the third data connecting member 73 is positioned on the interlayer insulating layer 160.

The data line 171 is connected to the source electrode of the switching transistor T2 through the contact hole 62 forming in the first gate insulating layer 141, the second gate insulating layer 142, and the interlayer insulating layer 160. The driving voltage line 172 is connected to the source electrode of the operation control transistor T5 through the contact hole 67 formed in the first gate insulating layer 141, the second gate insulating layer 142, and the interlayer insulating layer 160, is connected to the second storage electrode E2 through the contact hole 68 formed in the interlayer insulating layer 160, and is connected to the parasitic capacitor control pattern 125 through the contact hole 66 formed in the interlayer insulating layer 160.

One end of the first data connecting member 71 is connected to the first storage electrode E1 through the contact hole 61 formed in the second gate insulating layer 142 and the interlayer insulating layer 160, and the other end of the first data connecting member 71 is connected to the drain electrode of the second compensation transistor T3-2 and the drain electrode of the second initialization transistor T4-2 through the contact hole 63 formed in the first gate insulating layer 141, the second gate insulating layer 142, and the interlayer insulating layer 160.

One end of the second data connecting member 72 is connected to the source electrode of the first initialization transistor T4-1 through the contact hole 65 formed in the first gate insulating layer 141, the second gate insulating layer 142, and the interlayer insulating layer 160, and the other end of the second data connecting member 72 is connected to the initialization voltage line 127 through the contact hole 64 formed in the interlayer insulating layer 160.

The third data connecting member 73 is connected to the drain electrode of the light emission control transistor T6 through the contact hole 69 formed in the first gate insulating layer 141, the second gate insulating layer 142, and the interlayer insulating layer 160.

As above-described, the data conductor including the data line 171, the driving voltage line 172, the first data connecting member 71, the second data connecting member 72, and the third data connecting member 73 is connected to underlying connection conductors (i.e., the source electrodes or the drain electrodes of the several transistors T2, T3-2, T4-1, T4-2, T5, and T6, the first and second storage electrodes E1 and D2, the parasitic capacitor control pattern 125, and the initialization voltage line 127) through the contact holes 61 to 69. As the protrusion patterns 500 are positioned under the contact holes 61 to 69, the connection conductors are formed of the protruded shape, and the contact area of the data conductor and the connection conductors may be wider than the area of the contact holes 61 to 69. Also, even if the area of the contact holes 61 to 69 decreases, the contact area of the data conductor and the contact conductors may not be reduced. Accordingly, contact resistance between the data conductor and the contact conductors may be reduced while reducing the area of the contact holes 61 to 69, and an integration degree may be improved. Also, even if a misalignment of a photomask is generated in the process of forming the contact holes 61 to 69, since the positions of the contact holes 61 to 69 may not escape from the positions of the protrusion patterns 500, the layers positioned under the interlayer insulating layer 160 may be prevented from being damaged due to a position change of the contact holes 61 to 69.

A passivation layer 180 covering the data conductor is positioned on the data conductor. The passivation layer 180 is referred to as a planarization layer and may include the organic insulating material.

The first electrode 191 of the pixel electrode is positioned on the passivation layer 180. The first electrode 191 is connected to the third data connecting member 73 through the contact hole 81 formed in the passivation layer 180.

A pixel definition layer 350 is positioned on the passivation layer 180. The pixel definition layer 350 has an opening 351 overlapping the first electrode 191. The pixel definition layer 350 may include the organic insulating material, or may include the inorganic insulating material. A spacer 355 that may be formed of the same material and in the same process as the pixel definition layer 350 is positioned on the pixel definition layer 350. The spacer 355 has a function of supporting a mask such as a fine metal mask (FMM) used when forming the organic emission layer 370.

An organic emission layer 370 is positioned on the first electrode 191. The second electrode 270 is referred to as a common electrode and is positioned on the organic emission layer 370. The second electrode 270 may be formed throughout the plurality of pixels.

The first electrode 191, the organic emission layer 370, and the second electrode 270 form the organic light emitting diode OLED. The first electrode 191 may be the anode as a hole injection electrode, and the second electrode 270 may be the cathode as an electron injection electrode. In contrast, the first electrode 191 may be the cathode, and the second electrode 270 may be the anode. Holes and electrons are injected into the organic emission layer 370 from the first electrode 191 and the second electrode 270, respectively, and excitons generated by coupling the injected holes and electrons fall from an excited state to a ground state to emit light.

An encapsulation layer (not shown) protecting the organic light emitting diode OLED is positioned on the second electrode 270. The encapsulation layer may be in contact with the second electrode 270 or may be separated from the second electrode 270. The encapsulation layer may be a thin film encapsulation layer in which an organic layer and an organic layer are stacked. A capping layer and a functional layer may be positioned between the second electrode 270 and the encapsulation layer.

FIG. 31 to FIG. 32 are cross-sectional views taken along the line A-A' in FIG. 29. These exemplary embodiments have a difference in the position and the shape of the protrusion patterns 500 from the above-described exemplary embodiment of FIG. 30.

First, referring to FIG. 31, the protrusion patterns 500 is positioned between the barrier layer 111 and the buffer layer 120. That is, protrusion patterns 500 has a shape that is protruded from the upper surface of the barrier layer 111 in the third direction z. The cross-section of the protrusion patterns 500 may be approximately semicircular or half oval, or it may have other shapes. The protrusion patterns 500 may be made of the organic insulating material such as polyimide, however it may be made of the inorganic insulating material or the conductor such as the metal.

Referring to FIG. 32, the protrusion patterns 500 is positioned between the buffer layer 120 and the semiconductor layer 130. That is, the protrusion patterns 500 has a shape that is protruded from the upper surface of the buffer layer 120 in the third direction z. The cross-section of the protrusion patterns 500 may be approximately trapezoidal, or it may have other shapes. The protrusion patterns 500 is made of the metal such as molybdenum or titanium, or a metal oxide, however it may be made of the inorganic insulating material such as a silicon oxide, a silicon nitride, and the like. The protrusion patterns 500 may be made of the organic insulating material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: substrate
135: semiconductor
173: source electrode
175: drain electrode
500: protrusion pattern
520: interlayer insulating layer
521: contact hole
550: photoresist
610: first conductive pattern
630: second conductive pattern
700: photomask

What is claimed is:

1. A pattern structure for a display device, comprising:
a substrate;
a protrusion pattern positioned on the substrate;
a first conductive pattern covering an upper surface of the protrusion pattern;
an interlayer insulating layer positioned on the first conductive pattern and including a contact hole; and
a second conductive pattern positioned on the interlayer insulating layer and connected to the first conductive pattern through the contact hole,
wherein the contact hole overlaps the protrusion pattern and the first conductive pattern,
wherein a distance from a center portion of an upper surface of the first conductive pattern to an upper surface of the substrate is greater than a distance from a lateral edge portion of the upper surface of the first conductive pattern to the upper surface of the substrate.

2. The pattern structure of claim 1, wherein
the interlayer insulating layer is positioned directly on the first conductive pattern.

3. The pattern structure of claim 1, further comprising
a first organic insulating layer and a first barrier layer positioned between the substrate and the protrusion pattern.

4. The pattern structure of claim 3, further comprising
a second organic insulating layer and a second barrier layer positioned between the substrate and the protrusion pattern.

5. The pattern structure of claim 1, further comprising
a first organic insulating layer positioned between the substrate and the protrusion pattern, and
the protrusion pattern and the first organic insulating layer are integrally made.

6. The pattern structure of claim 1, wherein
a maximum distance from an upper surface of the substrate to an upper surface of the first conductive pattern is greater than a maximum distance from the upper surface of the substrate to an upper surface of the interlayer insulating layer.

7. The pattern structure of claim 1, wherein
the protrusion pattern is made of an inorganic insulating material and the protrusion pattern is in contact with the first conductive pattern.

8. The pattern structure of claim 1, wherein
the protrusion pattern is made of a metal.

9. The pattern structure of claim 1, wherein
a distance from a center portion of an upper surface of the second conductive pattern to an upper surface of the substrate is greater than a distance from a lateral edge portion of the upper surface of the second conductive pattern to the upper surface of the substrate.

10. The pattern structure of claim 1, further comprising a buffer layer positioned between the protrusion pattern and the first conductive pattern.

11. A pattern structure for a display device, comprising:
a substrate;
a protrusion pattern positioned on the substrate;
a first conductive pattern covering an upper surface of the protrusion pattern;
an interlayer insulating layer positioned on the first conductive pattern and including a contact hole; and
a second conductive pattern positioned on the interlayer insulating layer and connected to the first conductive pattern through the contact hole,
wherein the contact hole overlaps the protrusion pattern and the first conductive pattern,
wherein a maximum distance from an upper surface of the substrate to an upper surface of the first conductive pattern is greater than a maximum distance from the upper surface of the substrate to an upper surface of the interlayer insulating layer.

* * * * *